(12) United States Patent
Shiau et al.

(10) Patent No.: US 6,496,417 B1
(45) Date of Patent: Dec. 17, 2002

(54) METHOD AND INTEGRATED CIRCUIT FOR BIT LINE SOFT PROGRAMMING (BLISP)

(75) Inventors: Tzeng-Huei Shiau, Hsin-Pu (TW); Ray-Lin Wan, Fremont, CA (US); Han Sung Chen, Keelung (TW); Yu-Shen Lin, Taipei (TW); Wen-Pin Lu, I-Lan (TW); Tso-Ming Chang, Pan-Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/601,089
(22) PCT Filed: Jun. 8, 1999
(86) PCT No.: PCT/US99/12790
§ 371 (c)(1), (2), (4) Date: Jul. 27, 2000
(87) PCT Pub. No.: WO00/75931
PCT Pub. Date: Dec. 14, 2000

(51) Int. Cl.[7] .............................................. G11C 16/04
(52) U.S. Cl. ............................ 365/185.2; 365/185.18; 365/185.3
(58) Field of Search .................... 365/185.21, 185.3, 365/185.18, 185.11, 185.2

(56) References Cited

U.S. PATENT DOCUMENTS

| | | | |
|---|---|---|---|
| 5,399,891 A | 3/1995 | Yiu et al. | 257/316 |
| 5,414,664 A | 5/1995 | Lin et al. | 365/218 |
| 5,596,530 A | 1/1997 | Lin et al. | 365/185.29 |
| 5,617,364 A * | 4/1997 | Hatakeyama | 365/200 |
| 5,680,350 A | 10/1997 | Lee | 365/185.24 |
| 5,745,410 A * | 4/1998 | Yiu | 365/185.3 |
| 5,912,845 A * | 6/1999 | Chen | 365/185.3 |
| 6,240,023 B1 * | 5/2001 | Roohparvar | 365/185.3 |

* cited by examiner

Primary Examiner—A. Zarabian
(74) Attorney, Agent, or Firm—Mark A. Haynes; Haynes Beffel & Wolfeld LLP

(57) ABSTRACT

A method and an integrated circuit for performing a soft program after erase provides efficient convergence of over-erased floating gate memory cells disposed in bit lines. The soft program is applied to successive subject bit lines. The BLISP method includes selection of a selected bit line and applying the soft program to a subject bit line corresponding to the selected bit line. For integrated circuits having no defective bit lines, the subject bit lines comprise the selected bit lines. The BLISP method is adapted for low current consumption compared to bulk soft programming methods. In some embodiments, the integrated circuit includes defective bit lines. For these integrated circuits, the selection of the selected bit line includes indicating a bit line type corresponding to the selected bit line. The defective bit lines are logically replaced by redundant bit lines so that the soft program is applied to conforming selected bit lines and redundant bit lines corresponding to defective bit lines. The defective bit lines in the first memory array can be disabled during the soft program and replaced by corresponding redundant bit lines disposed in the second memory array, so that the soft program is not applied to the defective bit lines. By preventing application of the soft program to the defective bit lines, the BLISP method avoids consumption of excessive current that would otherwise be consumed by very low threshold voltage memory cells disposed on the defective bit lines. The excessive current would render the soft program method much less efficient.

16 Claims, 16 Drawing Sheets

METHOD AND INTEGRATED CIRCUIT FOR BIT LINE SOFT PROGRAMMING (BLISP)

BACKGROUND OF THE INVENTION.

1. Field of Invention

This invention relates to floating gate memory devices, such as flash memory, and in particular to methods and circuits for repairing over-erased floating gate memory cells.

2. Description of Related Art

Non-volatile memory design based on integrated circuit technology represents an expanding field. Several popular classes of non-volatile memory are based on arrays of floating gate memory transistors that are electrically erasable and programmable.

The act of programming a memory array of floating gate memory transistors in one popular approach involves injecting the floating gate of addressed cells with electrons which causes a negative charge to accumulate in the floating gate and the turn-on threshold of the memory cell to increase. Thus, when programmed, the cells will not turn on, that is, they will remain non-conductive when addressed with read potentials applied to the control gates. The act of erasing a cell having a negatively charged floating gate involves removing electrons from the floating gate to lower the threshold. With the lower threshold, the cell will turn on to a conductive state when addressed with a read potential to the control gate. For an opposite polarity array, programming involves selectively removing electrons from the addressed cells' floating gates.

Floating gate memory cells suffer the problem of over-erasure, particularly when erasing involves lowering the threshold by removing electrons from the floating gate. During the erase step, over-erasure occurs if too many electrons are removed from the floating gate leaving a slight positive charge. The positive charge biases the memory cell slightly on, so that a small current may leak through the memory even when it is not addressed. A number of over-erased cells along a given data line can cause an accumulation of leakage current sufficient to cause a false reading.

In addition to causing false readings, when floating gate cells are over-erased, it makes it difficult to successfully reprogram the cells using hot electron programming, particularly with embedded algorithms in the integrated circuits. This difficulty arises because the program current will be large and, due to series resistance, the effective $V_{DS}$ across cell will drop so that the electron injection efficiency will decrease.

Further, because the erase and program operations can affect different cells in a single array differently, floating gate memory designs often include circuitry for verifying the success of the erasing and programming steps. See, for instance, U.S. Pat. No. 4,875,118, entitled VOLTAGE MARGINING CIRCUIT FOR FLASH MEMORY, invented by Jungroth. If the array does not pass erase verify, the entire array is usually re-erased. The re-erase process can aggravate over-erased cells in the array.

One solution to the over-erase problem associated with the erase verification process is disclosed in U.S. Pat. No. 5,414,664, FLASH MEMORY WITH BLOCK ERASE FLAGS FOR OVER-ERASURE PROTECTION, issued to Lin et al. on May 9, 1995, which shows a method and a device where only those blocks which fail the erase verify operation are re-erased. Accordingly, a re-erase of the entire array after each verify operation is not required. This mitigates the over-erase phenomenon, but does not solve it entirely.

Thus, a repair process has been developed to correct over-erased cells. U.S. Pat. No. 5,233,562, entitled METHODS OF REPAIRING FIELD-EFFECT CELLS IN AN ELECTRICALLY ERASABLE AND ELECTRICALLY PROGRAMMABLE MEMORY DEVICE, issued to Ong, et al., describes processes for such repair using so-called drain disturb, source disturb or gate disturb techniques. After each repair in the Ong patent, a time-consuming repair verification operation of the entire array is provided. See, also, U.S. Pat. No. 5,416,738 to Shrivastava for further background information.

Another attempt to solve the over-erase problem is described in U.S. Pat. No. 5,546,340, entitled NON-VOLATILE MEMORY ARRAY WITH OVER-ERASE CORRECTION, issued to Hu et. al. Hu describes a negatively biased substrate. Hu describes bulk correction of over-erased devices within an array. Hu describes bulk correction of an array of over-erased devices as carried forth in a convergence technique which utilizes higher floating gate injection currents.

A low current method of programming flash EEPROMS is described in U.S. Pat. No. 5,487,033, entitled STRUCTURE AND METHOD FOR LOW CURRENT PROGRAMMING OF FLASH EEPROMS, issued to Keeney et. al. Keeney indicates that a control gate voltage may be stepped or ramped from a minimum value to a maximum value to further reduce the peak channel current and to allow the flash cell threshold voltage to be placed to an exact value, for Multilevel Flash EEPROM cell applications.

For further discussion of a technique for correction of over-erasure of flash EPROM's, please refer to U.S. Pat. No. 5,467,306, entitled METHOD OF USING SOURCE BIAS TO INCREASE THRESHOLD VOLTAGES AND/OR TO CORRECT FOR OVER-ERASURE OF FLASH EPROM's, issued to Kaya, et. al.

For many repair processes in the prior art, soft programs are implemented as bulk operations applied to all erased cells in a particular memory at the same time. Such bulk operation soft programs consume currents that are excessive for low power applications.

Another problem arises during repair (or soft program) processing after the erase cycle because the soft program cycle is applied to all of the erased cells at the same time, without regard to whether a particular bit line has one or more cells that have been over-erased to a defective condition. Defectively over-erased cells can have extremely low threshold voltages after several erase cycles. Bit lines containing such low threshold voltage cells are considered defective because they consume extremely high current during soft programming. Pumping circuits can be used to provide the data line voltage in a soft program cycle. Because of the limited current capability of such pumping circuits, the inefficiencies caused by the loss of current to over-erased cells are exacerbated when the data line voltage is provided by a pumping circuit.

In any case, the repair and repair verification processes are time-consuming.

Therefore, a method and device which repairs over-erased cells in FLASH memory, and other floating gate memory, more quickly and efficiently is needed.

SUMMARY OF THE INVENTION

One aspect of the invention provides a method for soft programming successive bit lines in an integrated circuit having floating gate memory cell arrays. The soft programming method is adapted to quickly and efficiently repair over-erased cells. The soft programming is suitable use in an embedded erase algorithm of other erase sequences for integrated circuit flash memory devices and for other floating gate memories disposed in integrated circuits. According to the invention, the soft program voltage is applied, on a bit line by bit line basis, to successive subject bit lines within an integrated circuit memory array. The bit line soft programming method is also referred to herein as the BLISP method.

The BLISP method is accomplished in a floating gate integrated circuit. The integrated circuit includes a first memory array having a plurality of bit lines. The bit lines correspond to floating gate memory cells. The memory cells are configured to be programmed and erased. Each of the cells has a drain, a source, and a control gate. The control gates of the cells are in communication with word lines.

The BLISP method includes maintaining the word lines at a predetermined word line voltage level. The method also includes generating a soft programming pulse having a soft programming voltage level, selecting a selected bit line, and during the maintaining, applying the soft programming voltage level to cells disposed on a subject bit line corresponding to the selected bit line. This basic BLISP method is typically used for memory arrays with zero defective bit lines, in which case, the subject bit line comprises the selected bit line.

In some embodiments, the first memory array includes conforming bit lines and defective bit lines and the BLISP method is adapted to logically replace the defective bit lines. The selecting includes indicating a bit line type corresponding to the selected bit line. The integrated circuit includes a redundancy system including a second memory array and processing resources. The second memory array has redundant bit lines. The processing resources are adapted to perform the indicating. The bit line types include a conforming bit line type and a defective bit line type. In response to indicating the conforming bit line type, the subject bit line comprises the selected bit line. In response to indicating the defective bit line type, the subject bit line comprises a subject redundant bit line. The subject redundant bit line logically replaces the selected bit line.

For the BLISP method adapted to logically replace the defective bit lines, the first memory array can include a plurality of blocks. Each of the blocks has at least one bit line. Prior to the soft programming the method includes erasing cells disposed in conforming bit lines disposed in blocks having set erase flags, and erasing cells disposed in subject redundant bit lines logically replacing defective bit lines disposed in the blocks having set erase flags.

For the BLISP method adapted to logically replace the defective bit lines, the applying can include the redundancy system turning off the selected bit line in response to the indicating of the defective bit line type, so that the soft programming voltage level is not applied to cells disposed on the selected bit line. The applying can also include the redundancy system turning on the subject redundant bit line so that the soft programming voltage level is applied to cells disposed on the subject redundant bit line.

For the BLISP method adapted to logically replace the defective bit lines, the bit lines in the first memory array can have addresses. The redundancy system processing resources can include a redundancy bit line decoding system having a first set of cells and a logic array. Each cell in the first set can store a bit line type indication corresponding to a predetermined bit line address. The indicating can include the decoding system receiving a bit line address input corresponding to the selected bit line. The indicating can also include the logic array comparing the bit line address input with the bit line type indication of the bit line corresponding to the address input. The applying can include responding to the indicating of the defective bit line type by generating a signal to switch off the soft programming pulse for all of the first memory array cells. The signal can also switch on the soft programming pulse for the subject redundant bit line. The applying can also include responding to the indicating of the conforming bit line type by generating a signal to switch on the soft programming pulse to the selected bit line.

For some of the embodiments having a first set of cells, the redundancy bit line decoding system can include an exclusive NOR gate coupled to the bit line address input and the corresponding bit line type indication. The applying can include, responsive to the indicating of the defective bit line type, the corresponding exclusive NOR gate toggling on a coupled redundant bit line enable signal.

In some embodiments, the selected bit lines have corresponding soft programming flags. The method includes, prior to the maintaining, setting the soft program flags for the selected bit lines. For some of the embodiments having soft programming flags, the bit lines in the first memory array have addresses. After the applying, the method includes determining whether the selected bit line address corresponds to a last address. Responsive to the selected bit line address corresponding to the last address, the soft programming flags for the selected bit lines are reset. Responsive to the selected bit line address not corresponding to the last address, the bit line address is incremented and the maintaining, generating, selecting, and applying steps are repeated for a next bit line corresponding to the incremented address.

A second aspect of the invention provides a method for correcting an over-erase condition within a non-volatile memory array. The method includes providing a first non-volatile memory array in an integrated circuit. The array has a plurality of memory cells. Each memory cell comprises a stacked pair of control and floating gates spaced above a channel region interposed between a source and drain region. The memory cells are arranged in bit lines. The method includes selecting a selected bit line. The method also includes applying a first voltage to the control gate, an active current limiter to the source region, a non-positive voltage to the channel region, and a positive second voltage to the drain region of memory cells disposed in a subject bit line corresponding to the selected bit line.

In some embodiments of the second aspect, the subject bit line comprises the selected bit line. In some embodiments, the first voltage is between minus one volt and six volts.

In some embodiments of the second aspect, the first non-volatile memory array includes conforming bit lines and defective bit lines. The selecting includes indicating a bit line type corresponding to the selected bit line. The integrated circuit includes a redundancy system including a second non-volatile memory array having a plurality of memory cells and processing resources. The second non-volatile memory array has redundant bit lines. The processing resources are adapted to perform the indicating. The bit line types include a conforming bit line type and a defective bit line type. In response to indicating the conforming bit line type, the subject bit line comprises the selected bit line. In response to indicating the defective bit line type, the second voltage is not applied to the selected bit line, and the subject bit line includes a subject redundant bit line logically replacing the selected bit line.

A third aspect of the invention provides an integrated circuit capable of implementing the BLISP method. The integrated circuit comprises a first memory array, processing resources, word lines, and a control circuit. The first memory array has floating gate memory cells disposed on bit lines. Each of the cells in the first memory array has a drain, a source, a floating gate, and a control gate. The processing resources are adapted to select selected bit lines for soft programming. The word lines are in communication with the control gates. The control circuit is coupled with the processing resources to apply a soft program to the floating gate memory cells disposed on subject bit lines, the subject bit lines corresponding to selected bit lines.

In some embodiments of the integrated circuit, the subject bit lines comprise the selected bit lines. In some embodiments, the selected bit lines have corresponding soft programming flags; and the control circuit is adapted to set the soft program flags for the selected bit lines prior to the maintaining.

In some embodiments, the integrated circuit includes a state machine circuit. The first memory array is arranged in blocks of memory cells. Each of the blocks has at least one bit line, and a block erase flag corresponding to the block. The state machine circuit and the processing resources are coupled to erase, prior to the soft programming, cells disposed in the subject bit lines disposed in blocks having set erase flags. The state machine circuit is adapted to determine whether the selected bit line address corresponds to a last address after the applying. In response to the selected bit line address corresponding to the last address, the state machine circuit resets the soft programming flags. For some of these embodiments, the integrated circuit includes an address counter. In response to the selected bit line address not corresponding to the last address, the address counter increments the bit line address and causes the integrated circuit to repeat the soft program for a next bit line corresponding to the incremented address.

In some embodiments of the integrated circuit, the control circuit is adapted to maintain the word lines at a predetermined voltage level. The voltage level set on the word lines is between approximately above ground and 0.5 volts. The applying includes applying a soft program pulse to the subject bit lines while maintaining the word line voltage. In some embodiments, the soft programming pulse repairs over-erased cells so that the over-erased cells may be reprogrammed absent a previously applied repair verify operation.

In some embodiments of the integrated circuit, the first memory array includes a plurality of blocks, arranged in rows and columns. Each block includes the bit lines, the word lines, and source lines. The control circuit is coupled to the bit lines, the source lines, and the word lines. The control circuit is adapted to set threshold voltages of the cells in selected blocks to a low threshold voltage. The control circuit includes voltage supply circuits to supply a voltage sequence to lower the threshold voltages of cells in each selected block. The voltage sequence results in a first group of cells having threshold voltages lowered below a selected limit for the threshold voltage. The voltage supply circuits supply a soft programming pulse to subject bit lines disposed in each selected block during a soft programming time interval across the source lines and the bit lines, while setting the voltage on the word lines to a level below the selected limit.

In some embodiments of the integrated circuit, the first memory array is arranged in rows and columns. The integrated circuit includes well lines coupled to wells of respective rows of cells in the first memory array. The control circuit includes voltage supply circuits to supply a well voltage on the well lines corresponding to the selected bit lines. The control circuit couples an active current limiter to the source lines corresponding to the selected bit lines. In some embodiments, the processing resources include a soft program repair state machine and an address counter.

In some embodiments of the integrated circuit, the first memory array bit lines comprise defective bit lines and conforming bit lines. The integrated circuit includes a redundancy system having a second array of floating gate memory cells disposed on redundant bit lines, and processing resources. Each of the cells in the second memory array has a drain, a source, and a control gate. The redundant bit lines logically replace the defective bit lines. The processing resources adapted to indicate bit line types of the selected bit lines in the first memory array are disposed in the redundancy system. The subject bit lines include selected conforming bit lines and subject redundant bit lines logically replacing selected defective bit lines. The control circuit is adapted to cooperate with the redundancy system to prevent applying of the soft program to floating gate memory cells disposed on defective bit lines.

For some of the embodiments of the integrated circuit having a redundancy system, the applying includes applying a soft program pulse. The bit lines in the first memory array have addresses. The redundancy system processing resources include a redundancy bit line decoding system. The redundancy bit line decoding system includes a first set of cells, a logic array, and processing resources. Each cell in the first set of cells stores a bit line type indication corresponding to a predetermined bit line address. The logic array is adapted to compare each bit line address input with the bit line type indication corresponding to the address input. The processing resources are adapted to receive bit line address inputs corresponding to the selected bit lines. The processing resources respond to a defective bit line type indication by generating a signal to switch off the soft programming pulse for the first memory array bit lines. The processing resources respond to a conforming bit line type indication by generating a signal to switch on the soft programming pulse for the selected bit line.

For some of the embodiments of the integrated circuit having a redundancy system, the applying includes applying a soft program pulse. Responsive to an indication of the conforming bit line type, the redundancy system processing resources are adapted to enable application of the soft program pulse to the selected bit lines. Responsive to an indication of the defective bit line type, the processing resources are adapted to disable application of the soft program pulse to the selected bit lines, and enable application of the soft program pulse to the subject redundant bit lines logically replacing the selected bit lines.

For some of the embodiments of the integrated circuit having a redundancy system, the first memory array is arranged in blocks of memory cells. Each of the blocks has at least one bit line, and a block erase flag corresponding to the block. The control circuit and the redundancy system processing resources are coupled to erase, prior to the soft programming, cells disposed in the selected conforming bit lines disposed in blocks having set erase flags. The control circuit and the redundancy system processing resources are also coupled to erase, prior to the soft programming, cells disposed in the subject redundant bit lines logically replacing defective bit lines, the defective bit lines disposed in blocks having set erase flags.

For some of the embodiments of the integrated circuit having a redundancy system, the first memory array and the second memory array are arranged in rows and columns. The integrated circuit includes well lines coupled to wells of respective rows of cells in the first memory array and coupled to respective rows of cells in the second memory array. The control circuit voltage supply circuits supply a well voltage on the well lines corresponding to the selected bit lines. The control circuit couples an active current limiter to the source lines corresponding to the selected bit lines.

For some of the embodiments of the integrated circuit having a redundancy system, the applying includes applying a soft program pulse. The redundancy system processing resources include a redundancy bit line decoding system having a first set of cells. Each cell in the first set stores a bit line type indication corresponding to a predetermined bit line address. The redundancy bit line decoding system also has a logic array. The logic array is adapted to compare each bit line address input with the bit line type indication corresponding to the address input. The redundancy bit line decoding system also has processing resources adapted to receive bit line address inputs corresponding to the selected bit lines.

The redundancy bit line decoding system processing resources are adapted to respond to a defective bit line type indication by generating a signal to switch off the soft programming pulse for the first memory array bit lines, and to switch on the soft programming pulse for the subject redundant bit line. The redundancy bit line decoding system processing resources are adapted to respond to a conforming bit line type indication by generating a signal to switch on the soft programming pulse to the selected bit line. The redundancy bit line decoding system can include exclusive NOR gates coupled to the bit line address inputs and the corresponding bit line type indications. Responsive to defective selected bit line type indications, the exclusive NOR gates are adapted to toggle on the coupled redundant bit line enable signals.

A fourth aspect of the invention provides a floating gate memory comprising floating gate cells, a first circuit, and a second circuit. The floating gate cell have a drain, a control gate, a floating gate, a well, and a source. The floating gate cells are disposed on bit lines in a first memory array. The first circuit is adapted to select selected bit lines. The second circuit is adapted to soft program floating gate cells in subject bit lines. The subject bit lines correspond to the selected bit lines. The second circuit is also adapted to supply a gate voltage to the control gate, an active current limiter to the drain, a well voltage to the well, and a source voltage to the source of the floating gate cells in the subject bit lines.

For some of the embodiments, the memory includes floating gate cells having a drain, a control gate, a floating gate, a well, and a source. The floating gate cells are disposed on bit lines in a second memory array. The second circuit is adapted to supply a gate voltage to the control gate, an active current limiter to the drain, a well voltage to the well, and a source voltage to the source of the cells in the second memory array. The subject floating gate cells are also disposed on redundant bit lines. The redundant bit lines disposed in the second memory array. The redundant bit lines logically replacing defective bit lines in the first memory array.

DETAILED DESCRIPTION

Figure 1A:
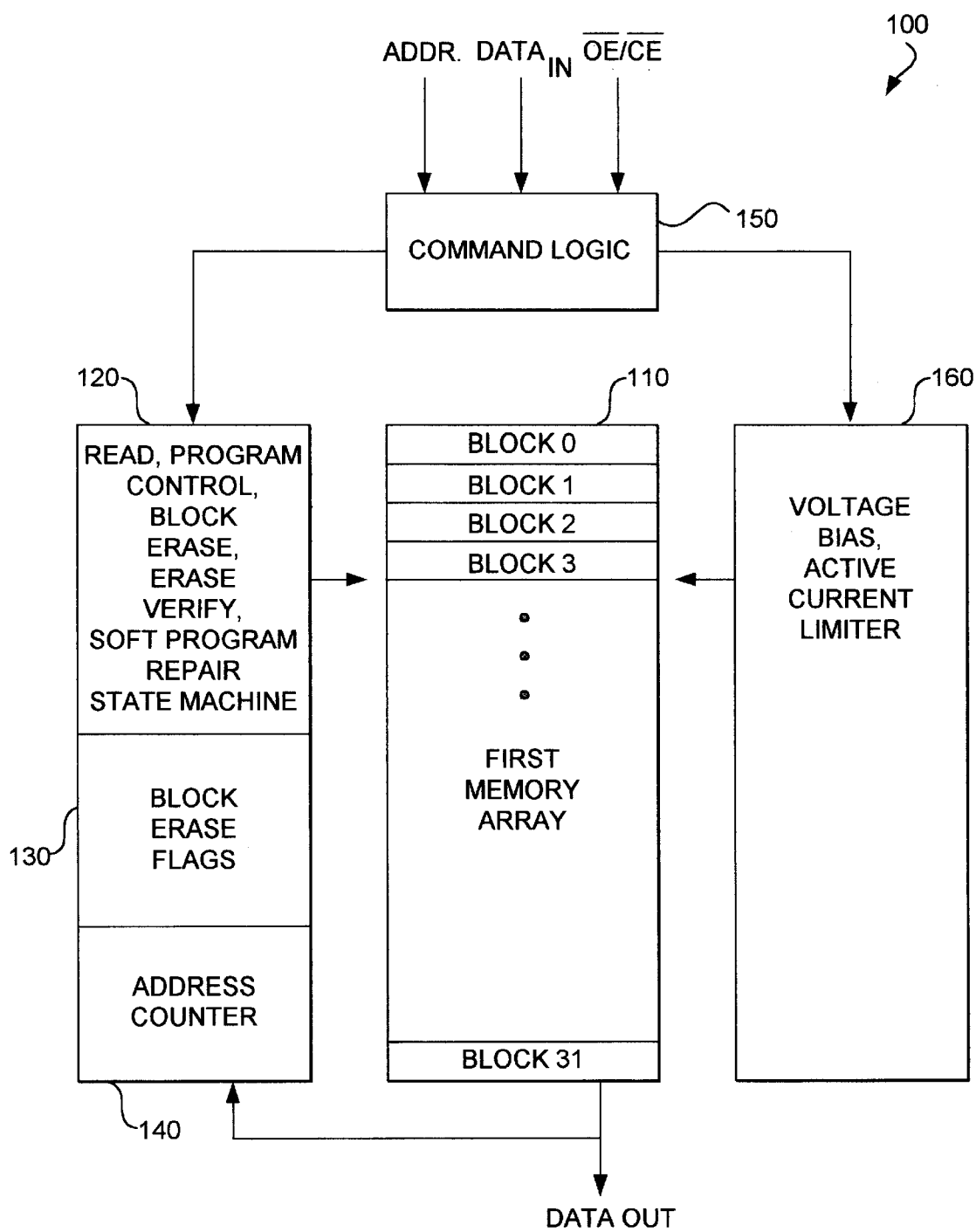
FIG. 1A is a schematic diagram providing an overview of an integrated circuit embodiment according to the invention for substrate current induced hot electron injection (SCIHE) approach for threshold voltage convergence at low $V_{CC}$ voltage.

A detailed description of preferred embodiments of this invention is provided with reference to the figures. The soft program of this invention may be part of an embedded erase sequence of a floating gate memory cell device, where such a device includes an array of cells arranged in blocks. The soft program generates pulses for quickly repairing over-erased cells on a bit line by bit line basis, while limiting the amount of current generated during the process. For memory arrays with no defective memory cells, the invention provides an efficient repair method that is capable of operating at low currents compared to bulk operations because the number of erased cells to which the soft program pulse is simultaneously applies is much lower for the bit line by bit line method.

For some memory arrays, certain defects render some of the bit lines therein unusable or "defective". The number of defective bit lines becomes especially problematic for high density memory arrays. The usable bit lines are referred to herein as "conforming".

The bit line defects can be the result of the fabrication process, including defective memory cells in the bit line, bit line to bit line metal shorts, bit line metal opens, bit line leakage, and other electrical defects. There is no apparent benefit to subjecting bit lines having defects other than those related to floating gate charging, to erase, program and soft program cycles, because regardless of the cell conditions, such defective bit lines will remain unusable. Also, the defects for such bit lines will likely result in the inability of the erase, program and soft program cycles to have their intended effects on the cells disposed in the bit lines.

Over-erased cells require greater electron injection and higher drain current during the soft program cycle. The higher soft programming drain current requirements for bit lines having cells that are substantially over-erased limit the soft programming efficiency. The high drain current for the over-erased cells can create voltage spikes during the soft programming. The voltage spikes result from the integrated circuit's inability to sustain a sufficiently high data line voltage. The higher drain currents also arise because the defective memory cells are unable to converge to within the proper threshold voltage range. The greater electron injection requirement for the low threshold voltage cells in the defective bit lines results in: (1) greater soft program cycle times for the defective bit lines, (2) more time-outs and cycle repeats if the soft program algorithm is subject to time out criteria, and/or (3) higher drain line current requirements during soft programming.

Substrate Current Induced Hot Electron Injection (SCIHE) Approach for $V_T$ Convergence at Low $V_{CC}$ Voltage During soft programming, a gate voltage is supplied to the control gate, a drain voltage is supplied to the drain, a well voltage is supplied to the well, and an active current limiter is coupled to the source. Embodiments of the invention have the advantage that usable electrons flowing from the current source are conducted to cells having lower $V_T$, where cell conductance is much higher, increasing soft program efficiency. The SCIHE invention is described by patent application Ser. No. 08/926,554, entitled METHOD AND CIRCUIT FOR SUBSTRATE CURRENT INDUCED HOT INJECTION (SCIHE) APPROACH FOR $V_T$ CONVERGENCE AT LOW $V_{CC}$ VOLTAGE, filed Sep. 10, 1997, which is incorporated herein by reference.

The use of the active current limiter coupled to the source has advantages over approaches that use a ground or a constant voltage source coupled to the source or approaches that use a diode connection. The active current limiter also has advantages over approaches where a source bias is established by a diode connection, a series resistance, or feedback circuitry monitoring the flash cell's drain and gate. Unlike various prior approaches, using the active current limiter has an advantage of helping to keep electron flow constant.

Figure 1B:
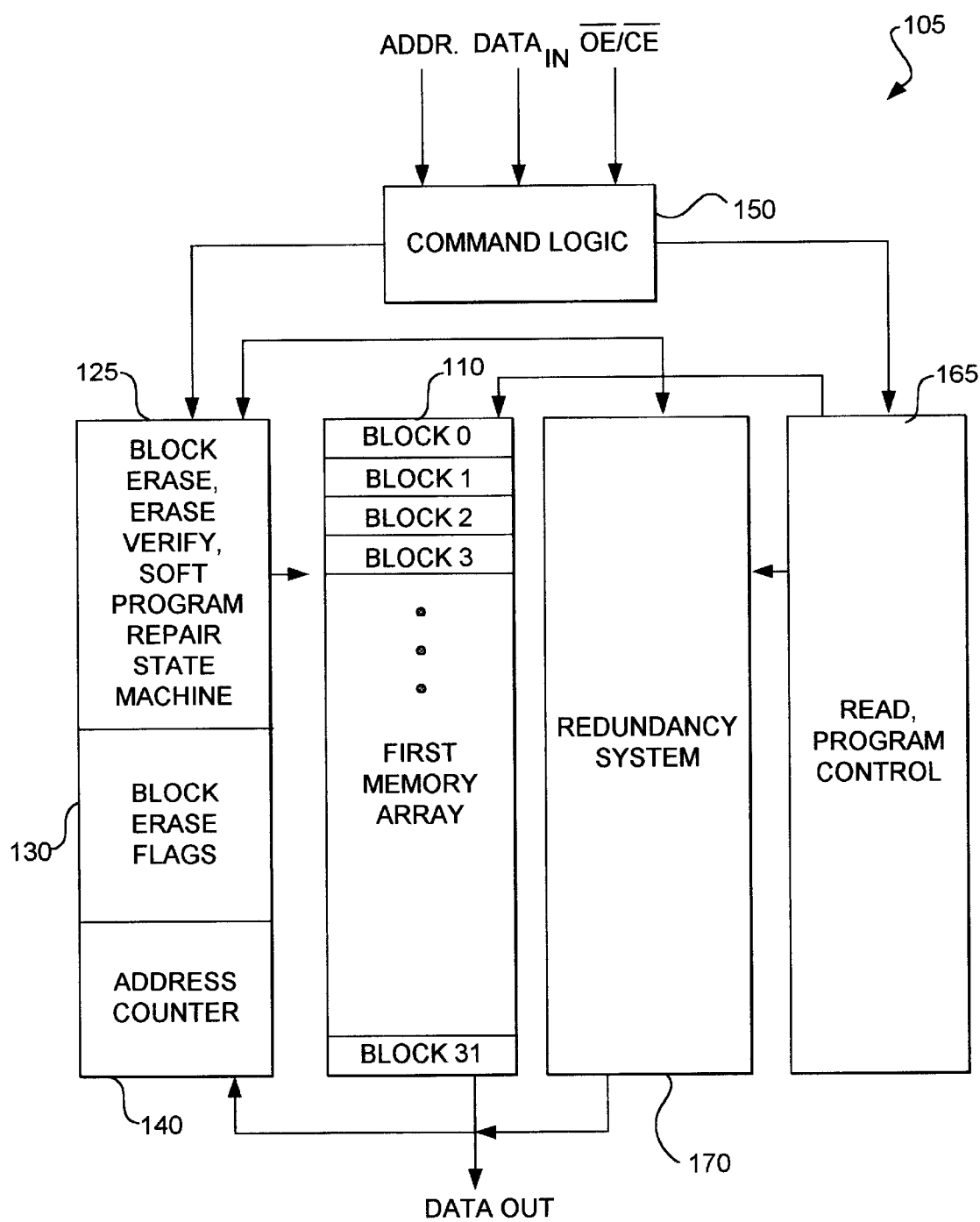
FIG. 1B is a schematic diagram providing an overview of an integrated circuit embodiment adapted to logically replace defective bit lines.

FIG. 1A shows the basic structure of a floating gate memory cell integrated circuit incorporating an embodiment of the SCIHE invention. The SCIHE integrated circuit 100 includes a first memory array, generally 110, which is divided into a plurality of blocks (32 blocks in the figure). Each block has a unique address for reading, programming, preprogramming, erasing and soft programming processes. The segmented architecture of the first memory array 110 allows application of the repair pulse of this invention to blocks of memory cells individually, thus allowing block by block repair of over-erased cells. The architecture of the first memory array 110 is described in detail below with reference to FIG. 2A that illustrates a segmented array architecture for the SCIHE approach 200A. The segmented array architecture for the SCIHE approach 200A is shown in a drain source drain configuration of a floating gate memory circuit including a portion of the first memory array 110. The discussion of FIG. 1B is provided in the Bit Line Soft Programming Method section below.

Still referring to FIG. 1A, coupled with the first memory array 110 are a voltage bias/active current limiter, generally 160, and a read/program control/block erase/erase verify/repair circuit, generally 120. Voltage bias/active current limiter 160 provides enhanced efficiency during soft programming. The read/program control/block erase/erase verify/repair circuit 120 is coupled to block erase flags 130. An address counter 140 is included for incrementing through memory cells, blocks, bit lines or the entire array for the erase/erase verify/repair sequence. Repair is also referred to as "soft program" herein.

The chip includes command logic 150 that is coupled to the address, data, and other control lines such as the output enable and chip enable signals. The command logic 150 interprets inputs to set a mode of operation for the voltage bias/active current limiter 160 and the read/program control/block erase/erase verify/repair circuit 120.

Figure 2A:
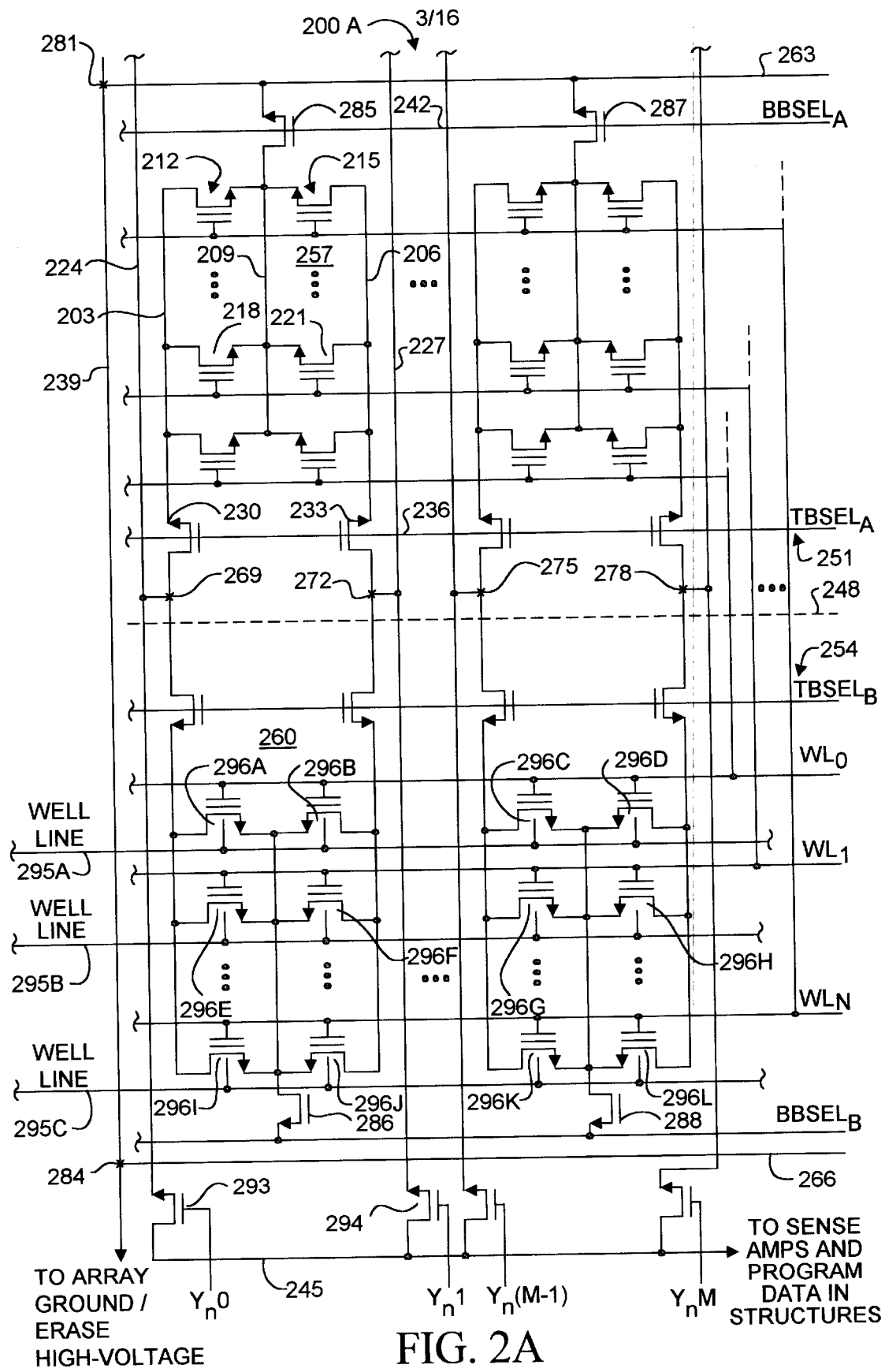
FIG. 2A is a circuit diagram showing a segmented array architecture for a floating gate memory cell device in which the SCIHE approach can be implemented.

Command logic 150 may be implemented as done in standard floating gate memory integrated circuits, such as the Am28F020 flash memory chip manufactured by Advanced Micro Devices, Inc. of Sunnyvale, California with additional commands of this invention for cell, block, bit line or array erase. In response to commands issued by the command logic 150, an embedded erase operation is executed by state machines in the read/program control/block erase/erase verify/repair circuit 120. The user, through a host CPU or otherwise, supplies address and data signals to the command logic 150 to indicate a preferred mode of operation. The modes executed by read/program control/block erase/erase verify/repair circuit 120 include a chip erase mode in which all blocks in the first memory array 110 are to be erased and a block erase mode in which selected blocks in the first memory array 110 are to be erased. In response to user input, blocks to be erased are identified by block or sector erase flags 130 stored on the chip. FIG. 2A illustrates the details of a segmented array architecture in a drain-source-drain configuration of the floating gate memory circuit in which this invention may be implemented, and like that described U.S. Pat. No. 5,399,891, entitled NON-VOLATILE MEMORY CELL AND ARRAY ARCHITECTURE, issued Mar. 21, 1995 which is incorporated by reference herein. Other array architectures may be used, as well.

The circuit includes a first local bit line 203 and a second local bit line 206 that are implemented by buried diffusion conductors. Also, included is a common source connection line 209 implemented by buried diffusion. A plurality of floating gate transistors have drains and sources coupled to the local bit lines 203, 206, and common source connection line 209. Any number of these floating gate transistors in a single block may suffer from over-erasure as a result of the erase step mentioned above, and in varying degrees.

The drains of the first column of transistors, generally 212, are coupled to the first local bit line 203, and the drains of the second column of transistors, generally 215, are coupled to the second local bit line 206. The gates of the floating gate transistors are coupled to word lines $WL_0$ through $WL_N$, where each word line (e.g., $WL_1$) is coupled to the gate of a transistor (e.g., transistor 218) in the first local bit line 203 and a transistor (e.g., transistor 221) in the second local bit line 206. The transistors 218 and 221 can be considered a two transistor cell with a shared source diffusion.

The act of charging the floating gate is called the program step for the floating gate memory cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the floating gate memory cell. This is accomplished through the F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate.

Individual blocks of cells are controlled by select signals, that is, top block select signals $TBSEL_A$ and $TBSEL_B$ and bottom block select signals $BBSEL_A$ and $BBSEL_B$. The individual control of the blocks provides the ability to apply a repair pulse to selected local bit lines 203 and 206.

Still referring to FIG. 2A, a first global bit line 224 and a second global bit line 227 are associated with each drain-source-drain block. The first global bit line 224 is coupled to the source of top block select transistor 230 through a metal-to-diffusion contact 269. Similarly, the second global bit line 227 is coupled to the source of top block select transistor 233 through a metal-to-diffusion contact 272. The drains of the top block select transistors 230, 233 are coupled to the first and second local bit lines 203 and 206, respectively. The gates of the top block selector transistors 230, 233 are thus controlled by a top block select signal $TBSEL_A$ on line 236.

In a similar manner, the gate of the transistor 285 is controlled by a bottom block select signal $BBSEL_A$ across line 242. The local common source connection line 209 is coupled to a terminal across conductor 263 through transistor 285. The drain of the transistor 285 is coupled to the common source connection line 209. The source of the transistor 285 is coupled to the conductor 263. In this architecture, the conductor 263 is a buried diffusion conductor which extends to a metal-to-diffusion contact 281 at a position displaced horizontally through the array. The metal-to-diffusion contact 281 provides contact to a vertical metal bus 239.

For sense amplifiers and program data in structures, a data line 245 is coupled to the global bit lines 224 and 227 which extend vertically through the array to respective column (or global bit line) select transistors 293, 294. Thus, the source of column select transistor 293 is coupled to global bit line 224, the gate of column select transistor 293 is coupled to a column (or global bit line) decode signal $Y_{n0}$, and the drain of the column select transistor 293 is coupled to data line conductor 245.

The blocks of floating gate memory cells as shown in FIGS. 1A and 1B are configured into a plurality of sub-arrays as illustrated in FIG. 2A which illustrates two sub-arrays within a larger integrated circuit. The sub-arrays represent a physical layout segmentation of the memory array. The sub-arrays are divided generally along dotted line 248 and include sub-array 251 generally above the line 248 and sub-array 254 generally below the line 248. A first group 257 of cells is laid out in a mirror image with a second group 260 of cells along a given bit line pair (e.g., 224, 227). As one proceeds up the bit line pair, the memory sub-arrays are flipped so as to share conductors 263, 266 (buried diffusion) and metal-to-metal diffusion contacts 269, 272, 275, 278. The conductors 263, 266 extend horizontally across the array to a vertical metal line 239 through metal-to-diffusion contacts 281, 284. The sub-arrays repeat on opposite sides of the metal bus 239 so that adjacent sub-arrays share a metal bus 239. The metal bus 239 is coupled to array ground and erase high voltage circuitry. Thus, the sub-array layout requires two metal contact pitches per column of two transistor cells for the global bit lines and one metal contact pitch for the metal bus 239.

Floating gate memory cells include wells 296A–296L. Well lines 295A–295C are shown in FIG. 2. Well lines 295A–295C are for applying bias voltages to wells 296A–296L. Well line 295A is coupled to wells 296A through 296D. Well line 295B is coupled to wells 296E through 296H. Well line 295C is coupled to wells 296I through 296L.

Figure 5:
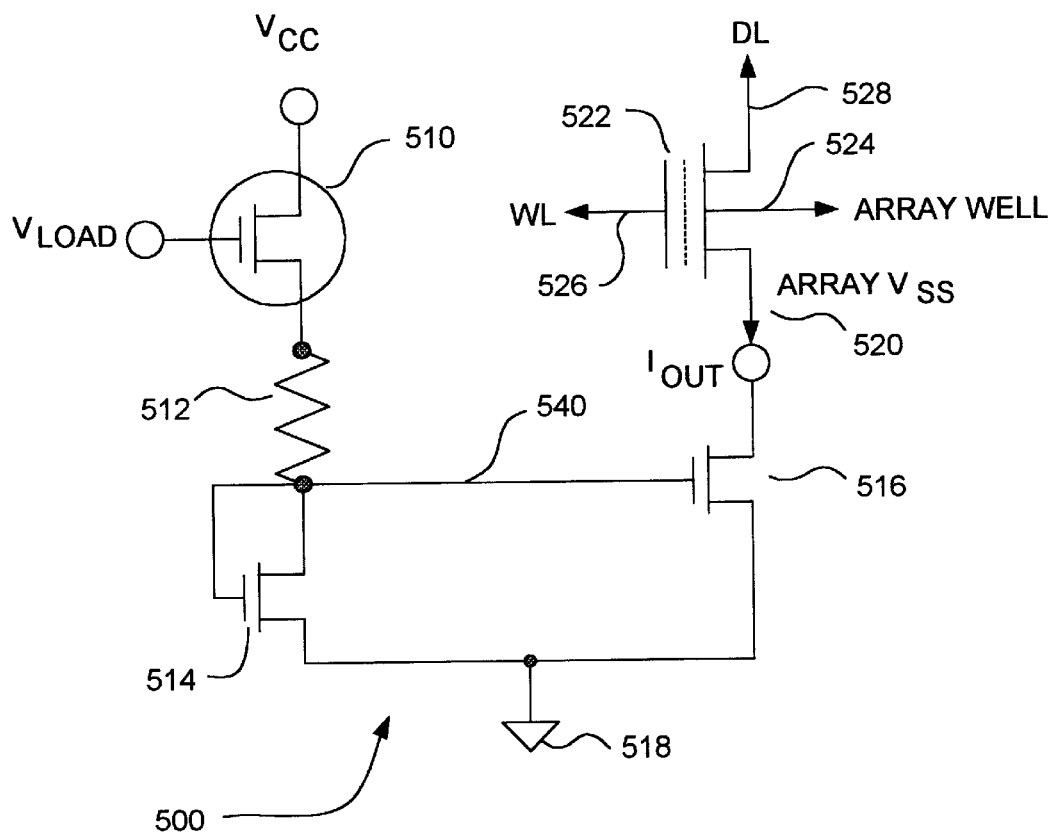
FIG. 5 is a diagram of a floating gate memory cell and a current limiter.

During a soft program pulse, a gate voltage is applied to gates of the floating gate cells via the word lines ($WL_{0-n}$), a drain voltage is applied via bit lines 224 and 227, a well bias is applied via the well lines 295A–295C, and an active current limiter is applied to the sources via a structure including transistors 285–288 and the additional circuitry shown in FIG. 5, which forms a current mirror. In such an architecture, the transistors 285–288 of FIG. 2A each correspond to a transistor such as the transistor 516 shown in FIG. 5. $BBSEL_A$ and $BBSEL_B$ each correspond to the line $V_{CS}$ in FIG. 5, which is coupled to the gate of transistor 516. Not shown in FIG. 2A are additional well lines for the other floating gates shown in FIG. 2A. However, additional well lines are used to apply well bias voltages to the other wells. Transistors 285, 286, 287, and 288 are also selector decode transistors. These transistors on their source sides are connected to a generator to support 0 volts or a positive voltage depending on the mode of operation.

In this approach, using an active current limiter rather than grounding the source, the power of the pumping circuitry can be better utilized to program the over-erased cells and decrease the leakage current from most of the cells by orders in magnitude. In an alternative system, the gate voltage can be stepped to decrease the current contribution from the over-erased cells.

The sector decode ability provided by the circuit of FIG. 2A, allows the circuitry to be implemented which applies a drain disturb style soft program pulse only to selected segments of the array by applying about 4 volts to the local drain lines, while coupling the source to an active current limiter.

Also, an alternative system will apply the soft program pulse of about 4 volts, or more depending on circuit parameters, through the source terminal of devices being soft programmed, while coupling the bit lines or drain terminals to an active current limiter. The same block-by-block decoding, and word line drivers can be utilized in this source disturb approach.

Figure 2B:
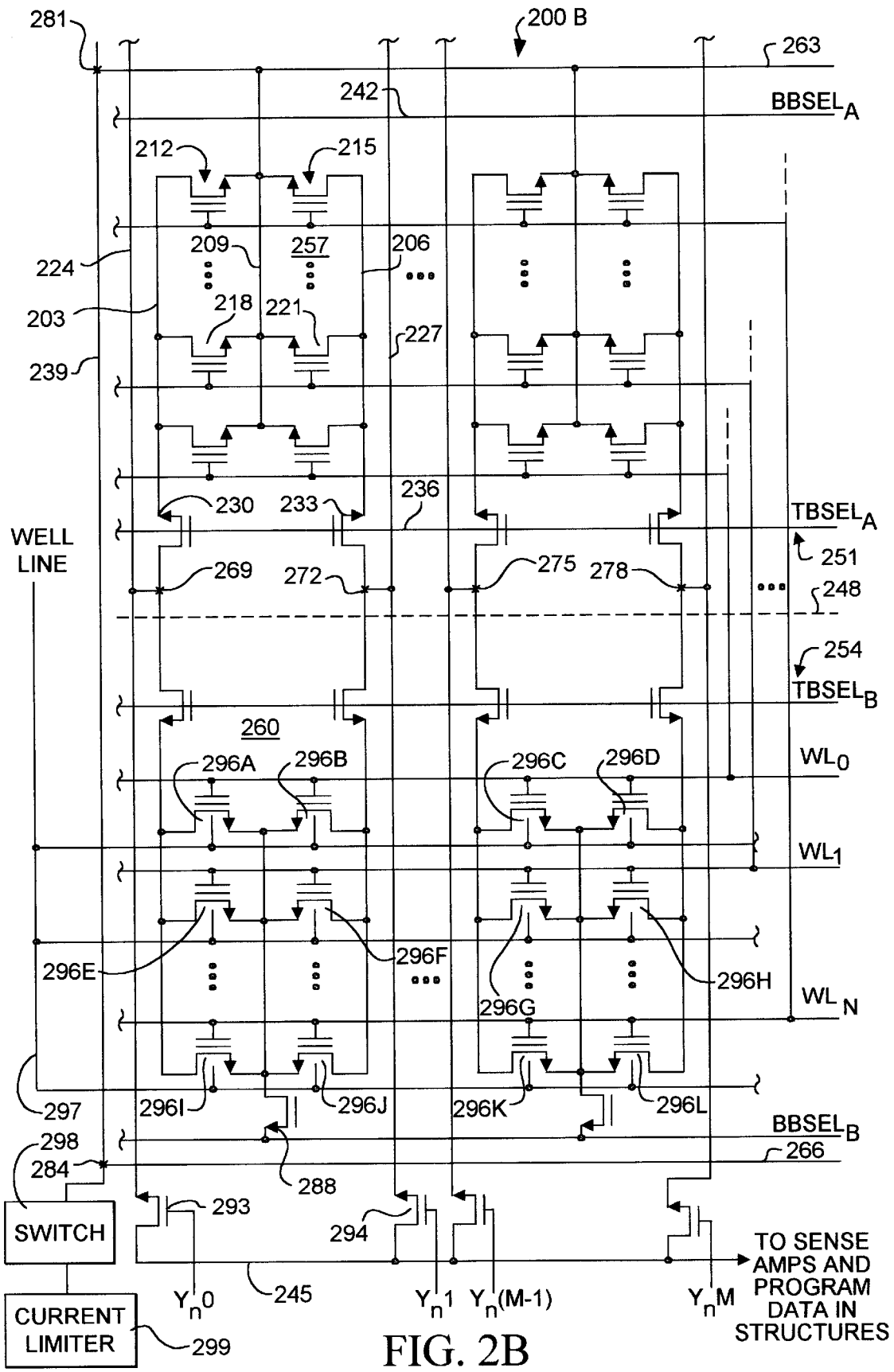
FIG. 2B is a circuit diagram showing a segmented array architecture including a common well line, and a current limiter in which the SCIHE approach can be implemented.

FIG. 2B is a circuit diagram showing a segmented array architecture including a common well line 297, and an active current limiter 299 in which the SCIHE approach can be implemented 200B and is similar to FIG. 2A. The common well line 297 allows application of a well voltage to multiple cells. Instead of transistors 285–288, FIG. 2B includes switch 298 and an active current limiter 299. The active current limiter 299 is coupled to a metal bus 239 via a switch 298. The active current limiter 299 provides a current sink commonly to multiple cells throughout the array. See the Bit Line Soft Program Method section below for the discussion of FIG. 2C.

Figure 3A:
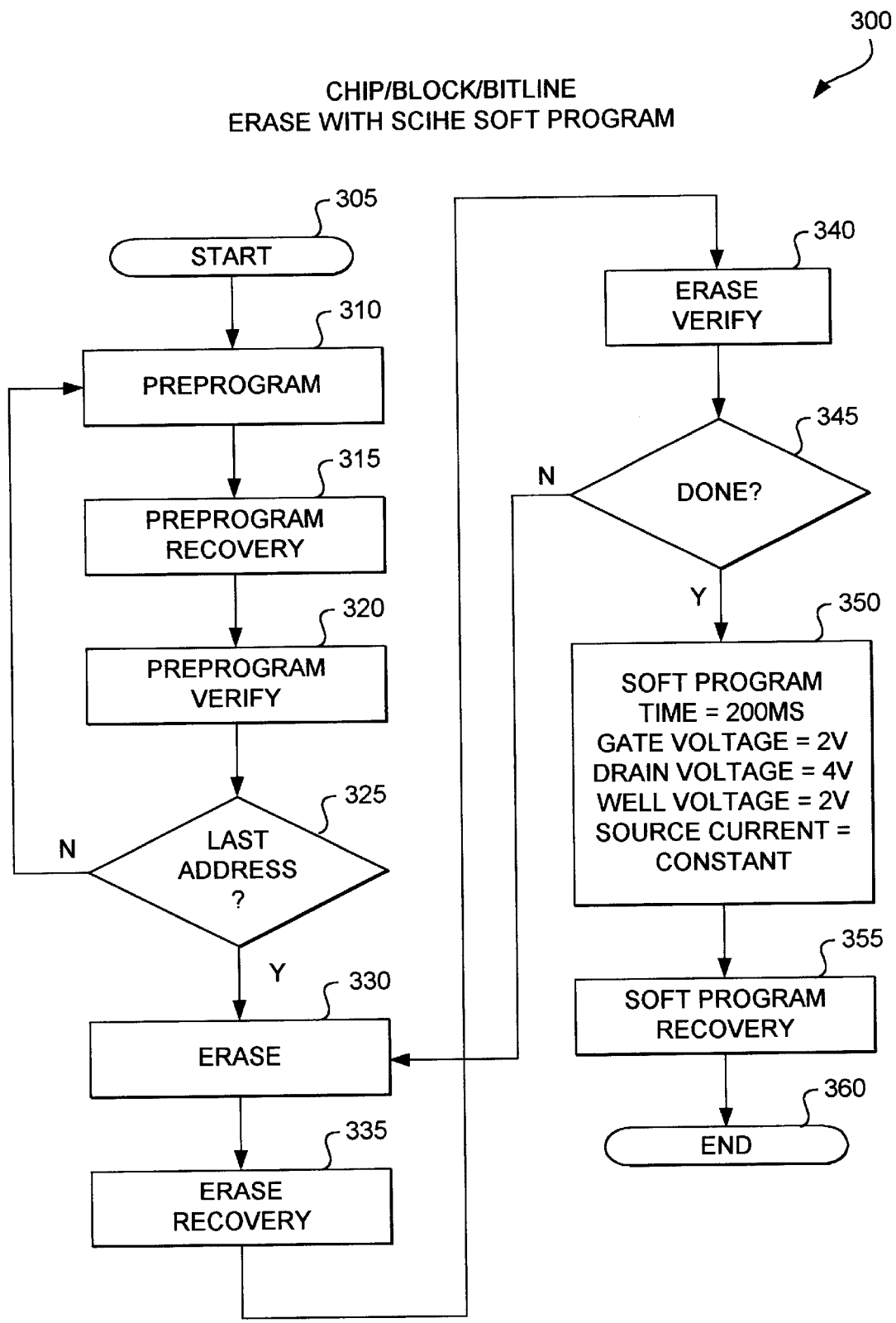
FIG. 3A is a flow chart showing a method for chip, block, or bit line erase process with soft programming steps according to the SCIHE approach.
Figure 3B:
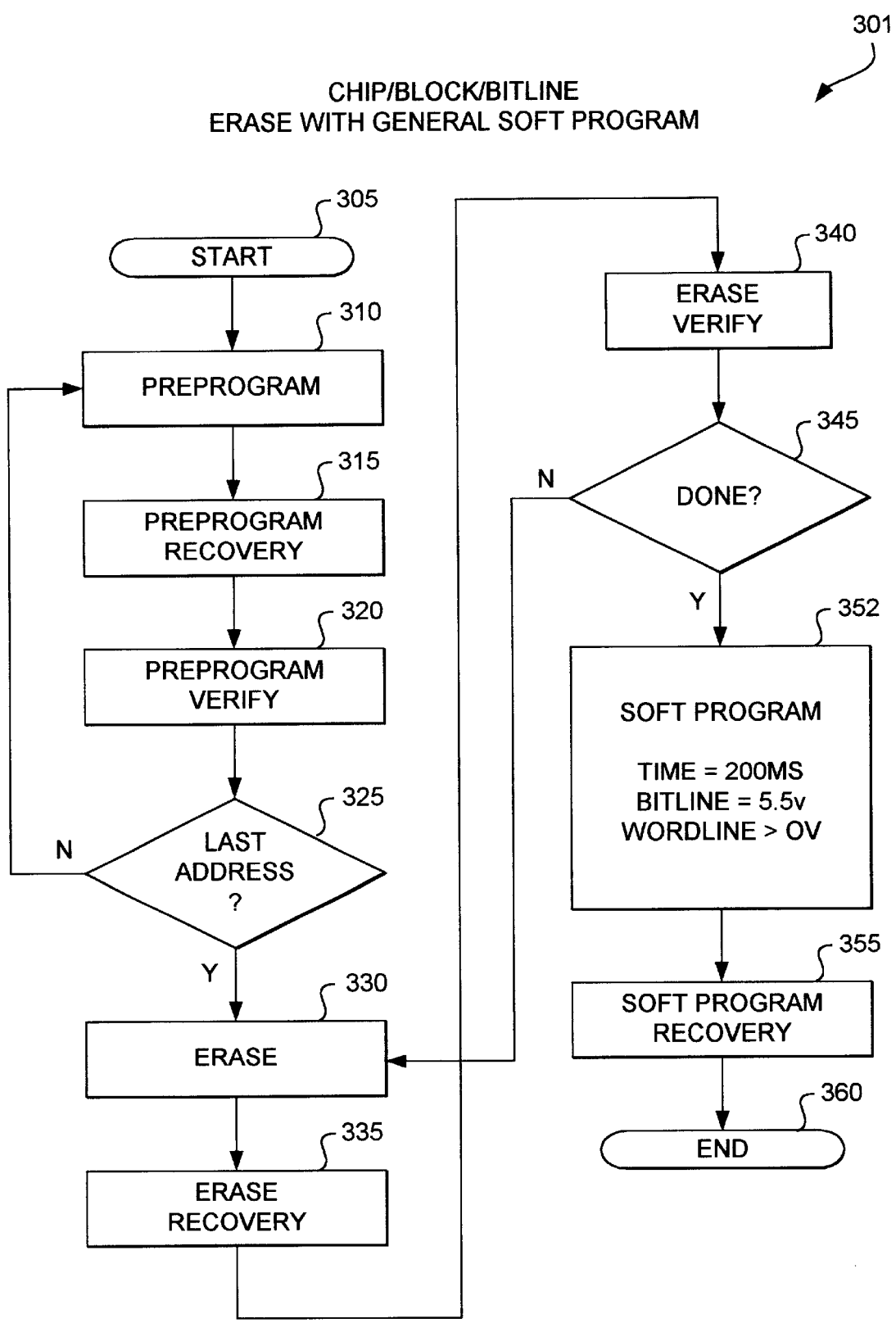
FIG. 3B is a flow chart showing a method for chip, block or bit line erase process with general soft programming steps.

Referring to FIG. 3A, an overall flow charts of a chip or block erase process, including the soft program steps of an embodiment of the SCIHE invention, is shown. FIG. 3B shows the same flowchart as FIG. 3A, except that the soft program in FIG. 3B does not require the inclusion of SCIHE invention features such as the active current limiter, or the well switch discussed below with reference to FIG. 4. The bit line by bit line soft program method can be utilized with the soft program settings as shown in either FIG. 3A or FIG. 3B. After starting the erase operation (step 305), pre-programming is initiated for the chip or block selected for erase, through a host CPU or otherwise through command logic 150 (step 310). At step 315, a pre-program recovery period occurs allowing the voltage to settle out or stabilize after pre-programming. At step 320, a pre-program verify process occurs. The system then checks to see if the last address in the chip, block or bit line has been pre-programmed (step 325). If not, the process starting at the pre-programming step 310 is repeated until all cells in the chip, block or bit line have been preprogrammed.

After pre-programming, the erase operation at step 330 is executed. The erase step 330 is followed by the erase recovery period 335 to allow the erase voltage to settle out. Next, an erase verify operation 340 is performed. Then, the system checks to see if the erase process is complete at step 345. If not, it returns to perform the erase operation 330 until the erase operation 330 is complete.

When the erase operation is complete, the SCIHE soft program at step 350 is initiated according to the SCIHE process shown in FIG. 3A, in which the soft program pulse is applied to all cells in the entire chip, or the block or bit line subject of the erase operation in parallel. The soft program step 350 includes applying a gate voltage to the gates, a drain voltage to the drains, a well voltage to the wells, and a constant source current to the sources.

A generalized soft program step 352 is provided in FIG. 3B. The generalized soft program 352 does not necessarily include SCIHE features such as the active current limiter, or the well switch. For both soft programs, a soft program recovery occurs at step 355. The process ends at step 360.

Figure 4:
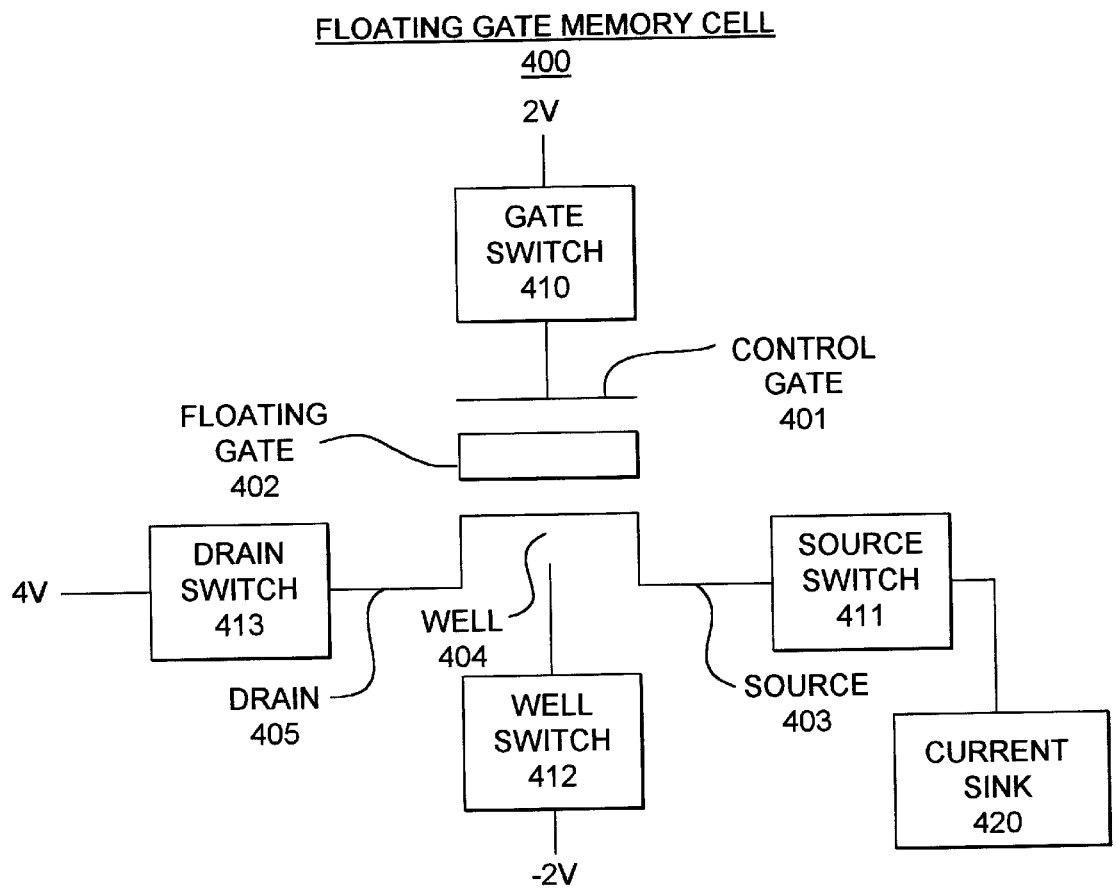
FIG. 4 is a circuit diagram of a floating gate memory cell with bias voltages and current sink.

FIG. 4 shows a floating gate memory cell configured for soft programming according to an embodiment of the SCIHE invention. The floating gate memory cell 400 includes a control gate 401, a floating gate 402 under the control gate, a source 403, a well 404, and a drain 405. The floating gate memory cell 400 comprises a control gate 401 and a floating gate 402 from a stacked pair of polysilicon layers having a dielectric layer interposed between them. The gate switch 410 is coupled to the control gate 401 and provides a control gate voltage of approximately 2 volts. The source switch 411 is coupled to the source 403 and provides an active current limiter 420 to the source 403. The well switch 412 is coupled to the well 404 and provides a well bias voltage of approximately 2 volts to the well 404. A drain switch 413 is coupled to the drain 405 and provides a drain voltage of approximately 4 volts to the drain 405.

The configuration shown in FIG. 4 allows for soft programming of the floating gate memory cell 400. The soft programming causes hot electron injection of electrons onto the floating gate. In one embodiment of the invention the length ($L_{mask}$) of a cell is 0.6 micrometers, and the width ($W_{mask}$) is 0.4 micrometers. The tunnel oxide is 10 nanometers, and the oxide nitrite oxide (ONO) layer is approximately 14 nanometers. The floating gate memory cell 400 is an n-channel transistor.

A triple well architecture is used for a cell. The triple well structure includes a deep N-well, a P-well, and an N-well. If the P-well is kept grounded, a twin well structure can be used. The P-well acts as a channel well and the deep N-well acts as the isolation well. During soft programming, the channel well can be biased to an non-positive voltage, while the isolation well is kept equal to or larger than Vcc.

An advantage of use of an active current limiter is that usable electrons flowing from the source are conducted to lower $V_T$ bits where the cell conductance is much higher. Therefore, the soft program efficiency will be greater. The conductance modulation is through the charged source voltage and may be proportional to $\log_{10}\{-[V_S+_G V_T(V_{SB})]/110 \text{ mV}\}$, where $_G$ is the gate coupling ratio. The active current limiter 420 applies a negative constant current to the source. The configuration shown has the additional benefit that the drain current could be supplied directly from $V_{CC}=5$ volts, which may be larger than the current available from charge pumping circuitry. If $V_{CC}$ is lowered, the relative voltage can be changed accordingly. The use of a negative well bias will require another pumping circuit. If a positive pump circuit is used for the drain voltage, then the negative pump circuitry will not be needed. The difference between the drain voltage and the well bias voltage is important.

A fast $V_T$ convergence is desirable. The longer the soft program time, the tighter the $V_T$ convergence. The upper limit is the total sector electrical erase time. Initially bits (cells) will have a wider $V_T$ distribution, and the initial source voltage will be high. Optionally, a stepped or ramped word line voltage (gate voltage) may be used to change the drain to source voltage margin. The voltage between gate and source will affect the saturated value of converged $V_T$.

Since the soft program current is also suppressed through the $V_T(V_{SB})$ from body effect, the higher impurity concentration of a substrate is helpful. The high impurity concentration of the substrate will suppress the short channel effect and its related leakage. The drain coupling ratio, which may affect the leakage, may also be reduced. The drain coupling is a capacitance coupling effect from the N+ floating gate overlap.

More details regarding methods of soft programming floating gates are described in U.S. Pat. No. 5,745,410 entitled METHOD AND SYSTEM FOR SOFT PROGRAMMING ALGORITHM, issued Apr. 28, 1998, which is incorporated herein by reference.

FIG. 5 is a diagram of a memory cell and an active current limiter according to an embodiment of the present SCIHE invention. The current limiter circuit 500 corresponds to active current limiter 420 of FIG. 4. The current limiter switch includes transistor 510 coupled to $V_{CC}$ and $V_{load}$, resistor 512, transistor 514, and transistor 516. $I_{out}$ is coupled to source switch 411. $V_{load}$ is used to control the current from $I_{ouut}$. $I_{out}$ is coupled to array $V_{SS}$ 520, which is coupled to sources of memory cells including memory cell 522. Also shown in FIG. 5 are word line 526, array well 524, and drain line 528. With the configuration shown in FIG. 5, current is limited from the sources of memory cells in an array of memory cells.

A block of memory cells may be programmed simultaneously. To program a block of 512K cells simultaneously, the current limiter circuit 500 is constructed to cause the total current through the current limiter circuit 500 to be approximately 2 milliamperes for the block. In an alternative embodiment, the current for the 512K cell block may be less than 10 milliamperes (mA).

Figure 6:
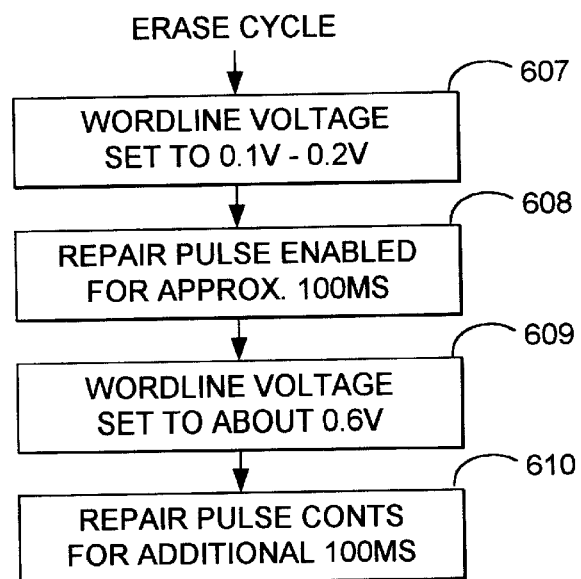
FIG. 6 is a flow chart illustrating a two-stage soft programming process.

Turning to FIG. 6, another embodiment of the SCIHE invention is shown. Optionally, as shown here, the repair pulse may be applied in two sequential steps. In the first step, the word line voltage is maintained at a first level about ground, and in the second step, the word line voltage is maintained at a second level about ground. FIG. 6 shows that during steps 607 through 610, the word line voltage is maintained at two different levels while the repair pulse is applied to the bit line.

First, step 607 provides that the word line voltage is maintained above ground, e.g. between 0.1 volts and 0.2 volts, for a period of time, e.g. approximately 100 milliseconds. The first stage of the repair pulse is maintained during step 608. By first applying a lower word line bias during the first soft program steps 607 and 608, the current of the "over-erased" cells is less than would occur with higher word line voltage, yet a majority of the over-erased cells are pushed toward being "normal cells" (i.e. they recover the threshold voltage to a better value). Thus, after the first soft program steps 607 and 608, some over-erased cells have been recovered and the second step can be applied. The second steps 609 and 610 include setting the word line voltage to about 0.6 volts, which is applied for an additional period of time, e.g. approximately 100 milliseconds while the repair pulse is applied.

Accordingly, during the repair pulse, the word line voltage is driven in two stages, the first stage occurring during the 100 milliseconds period while the word line voltage is maintained between approximately 0.1 volts and 0.2 volts, the second stage during the 100 milliseconds period while the word line voltage is maintained at about 0.6 volts. This two-step process enhances the soft programming of the over-erased cells with less operating current and better operating efficiency.

The following table shows alternative values for a two-step soft programming process:

| | 3 V Technology | | | | |
|---|---|---|---|---|---|
| | Drain | Gate | Source $I_S$ for a 512K cell block | Substrate | Time |
| 1st step | +5.5 V | +2.5 V | 1.5 mA | GND | 50 ms |
| 2nd step | +5.5 V | +3.1 V | 1.5 mA | GND | 100 ms |

| | 5 V Technology | | | | |
|---|---|---|---|---|---|
| | Drain | Gate | Source $I_S$ for a 512K cell block | Substrate | Time |
| 1st step | $V_{cc}$ | 0 V | 1.2 mA | GND | 50 ms |
| 2nd step | $V_{cc}$ | 0.6 V | 1.2 mA | GND | 50 ms |

The following shows voltage and current ranges for soft programming:

| Drain | Gate | Source | Substrate |
|---|---|---|---|
| <Drain Junction Breakdown Voltage $V_{DB}$ <8 V | $V_{GS}$ >−1 V $V_{DG}$ >2 V | $I_S$/512K cells <10 mA VSB >0.5 V | ≦0 V |

Accordingly, the method and circuit for substrate current induced hot e injection for $V_T$ convergence at low $V_{CC}$ voltage have been provided. The method and circuit provide quicker and more efficient repairing of over-erased cells in a flash memory.

Figure 7:
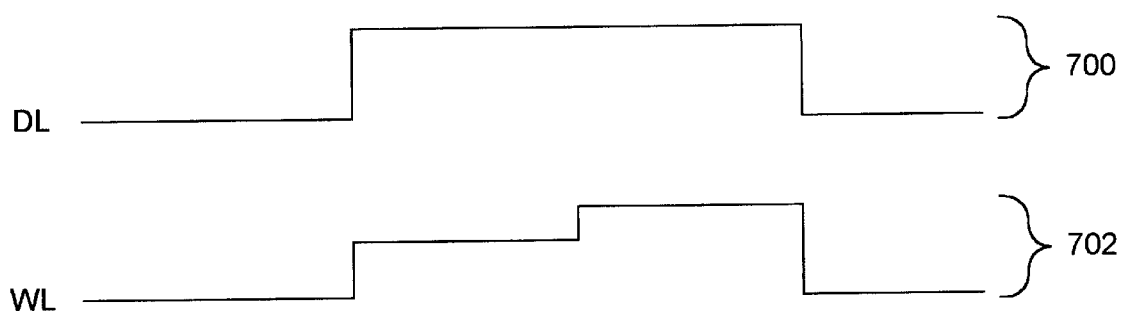
FIG. 7 is a timing diagram of a programming sequence.

FIG. 7 is a timing diagram of one embodiment of a programming sequence. Voltage is applied to drain as shown by trace 700. A changing voltage is applied to the word line during programming as shown by trace 702. The drain and gate voltage may be applied simultaneously at each step, or the gate voltage may be applied first.

Bit Line Soft Programming Method

One aspect of the invention is a method for soft programming successive bit lines in an integrated circuit having floating gate memory cell arrays. The method can be performed in an integrated circuit similar to a SCIHE integrated circuit 100 shown in FIG. 1A, or in any floating gate memory integrated circuit that provides bit line selection capability.

The integrated circuit includes a first memory array 110 having a plurality of bit lines. The bit lines correspond to floating gate memory cells. The memory cells are configured to be programmed and erased. Each of the cells has a drain, a source, and a control gate. The control gates of the cells are in communication with word lines. For memory arrays with no defective bit lines, the bit line soft program (BLISP) method 800, as shown in FIG. 8A, and described below is used.

Figure 2C:
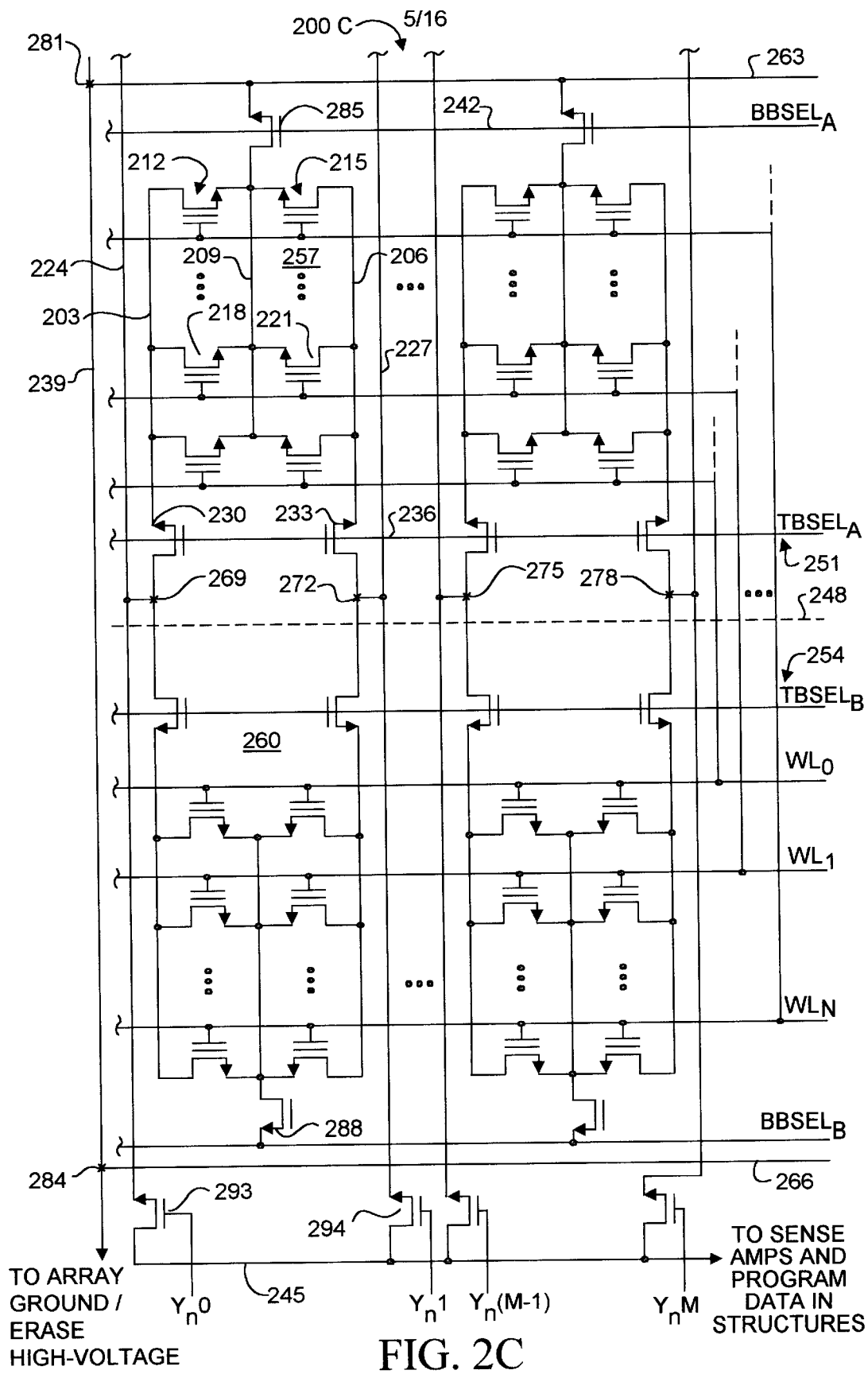
FIG. 2C is a circuit diagram showing a generalized segmented array architecture in which the BLISP method can be implemented.
Figure 2:
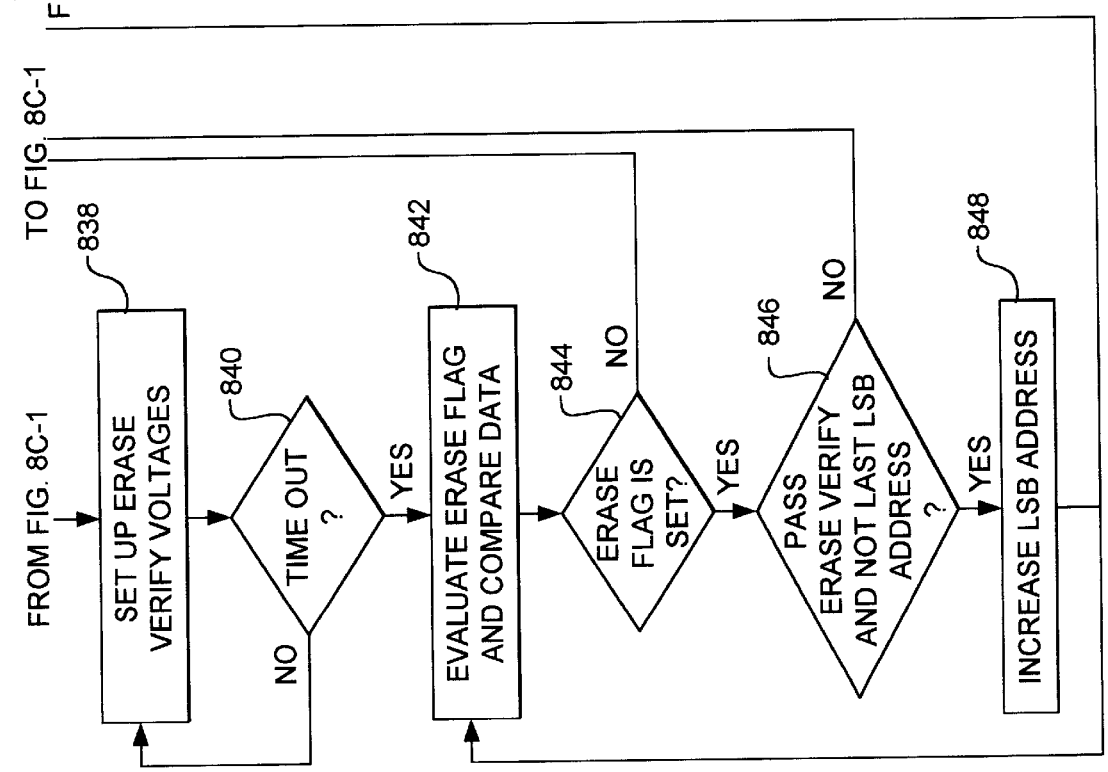

FIGS. 2A, 2B and 2C illustrate the details of segmented array architectures in a drain-source-drain configuration in which the BLISP method 800 may be implemented. These architectures illustrate different embodiments of the first memory array 110. FIG. 2C shows a generalized segmented array architecture in which the BLISP method 800 can be implemented 200C. The generalized segmented array architecture in which the BLISP method 800 can be implemented 200C does not incorporate the SCIHE invention soft program features. The BLISP method 800 can be implemented in any floating gate memory array that provides column (or bit line) decode signals (such as $Y_{n0}$ through $Y_{nM}$) corresponding to each bit line. The bit line soft program method 800 does not require the block segmented architecture illustrated in FIGS. 2A, 2B and 2C.

As shown in FIG. 2C, the first memory array 110 includes a plurality of bit lines including the first local bit line 203 and the second local bit line 206. As shown in FIG. 2C, the local bit lines, such as the first local bit line 203 and the second local bit line 206, are coupled to drain terminals of floating gate memory cells in the first memory array 110. Each of the floating gate memory cells has a drain, a source, and a control gate. The control gates of the cells are in communication with word lines, shown in FIG. 2C as the word lines $WL_o$ through $WL_N$.

Figure 8A:
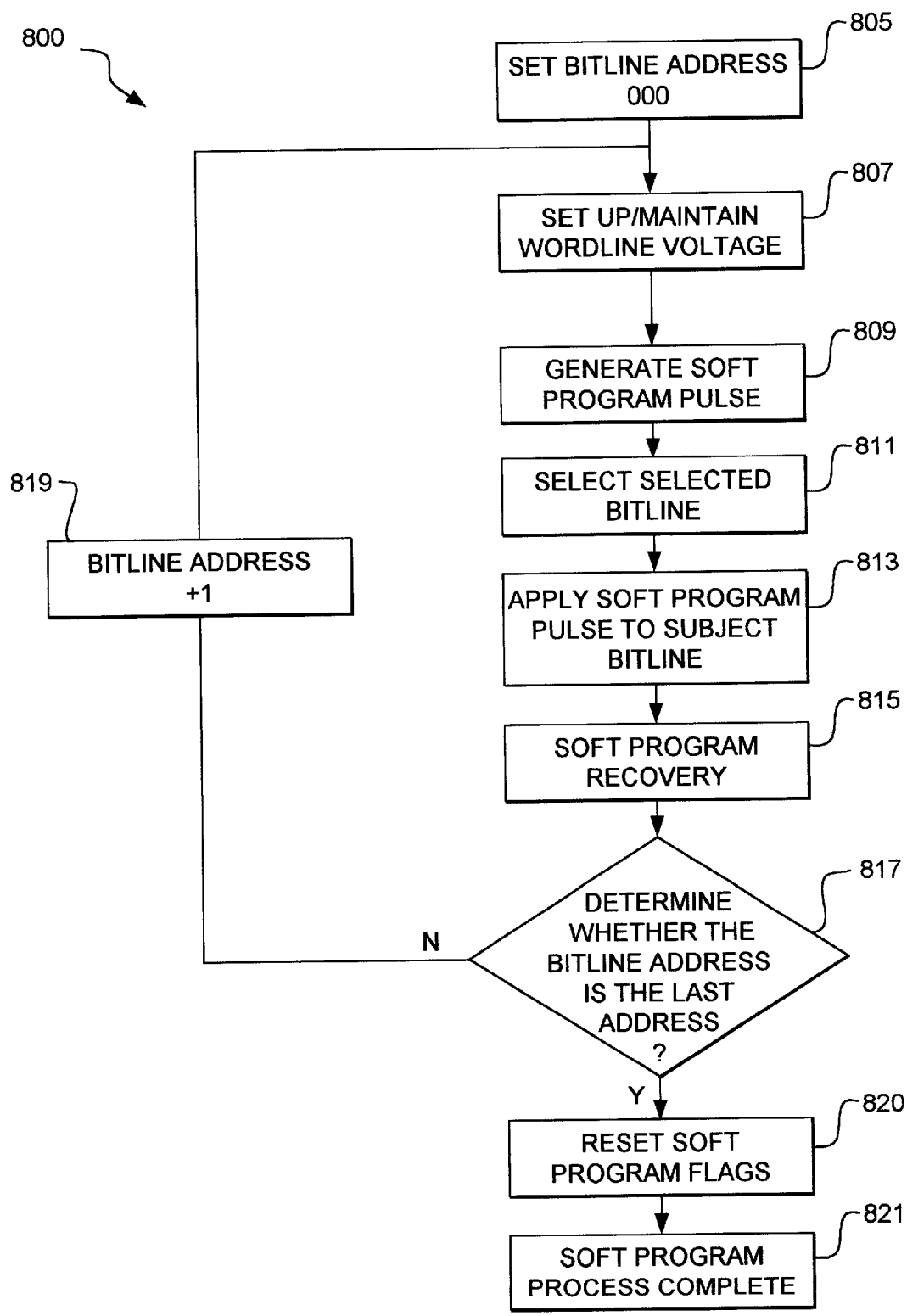
FIG. 8A is a flow diagram illustrating the bit line soft program (BLISP) method.

As shown in FIG. 8A, the bit line soft programming (BLISP) method 800 for floating gate memory cells includes setting up and maintaining 807 the word lines at a predetermined word line voltage level. In some embodiments, the predetermined word line voltage level is between approximately above ground and 0.5 volts.

The BLISP method continues by generating 809 a soft programming pulse having a soft programming voltage level, selecting 811 a selected bit line, and applying 813 the soft programming voltage level, or pulse, to a subject bit line. The subject bit line corresponds to the selected bit line. The soft programming voltage level is applied to cells disposed on the subject bit line.

The BLISP method includes a soft program recovery 815, that typically occurs directly after the applying 813 of the soft program pulse to the subject bit line. The soft program recovery provides the time needed to for the selected bit line to recover from the soft program voltage (which is approximately five to six volts for some embodiments of the invention) to the normal standby voltage condition of approximately zero volts for some embodiments of the invention. The soft program recovery also provides the time needed for the word lines to recover back from the two-step voltage application to zero volts. Therefore, after the soft program recovery 815, the word lines and the bit lines are settled back to their respective normal standby conditions.

The BLISP method 800 is adapted to consume substantially less power and current than the prior art bulk operations because the number of erased cells to which the soft program pulse is simultaneously applied is much lower for the bit line by bit line method. In some embodiments, the subject bit line comprises the selected bit line.

Typically, circuits implementing bulk operation soft program methods require direct application of a power line to supply the required high current, e.g., 10 to 90 milliamperes of current driving ability. On the other hand, for low power applications, current consumption exceeding 10 milliamperes is not allowed. Low power applications typically have low voltage, and direct application of the voltage does not provide the current level needed for bulk soft programming. Therefore, a pumping generator is required to provide the high voltage. However, the pump generators are characterized by intrinsically limited current supplies that are usually only a few milliamperes.

In some embodiments of the BLISP method 800, the first memory array 110 includes a plurality of blocks, as shown in FIGS. 1A and 1B. Each block has at least one bit line. Prior to the soft programming, the method includes erasing cells disposed in the bit lines disposed in blocks having set erase flags. In some embodiments, the soft programming pulse repairs over-erased cells so that the over-erased cells may be reprogrammed absent a previously applied repair verify operation. The repair verify operation can be omitted, for example, when the over-erased cells are well-characterized by prior testing and evaluation.

In some embodiments, the bit lines in the first memory array 110 have addresses. The integrated circuit includes processing resources including a redundancy bit line decoding system, such as the bit line address decoding system 915 shown in FIG. 9B. The selecting includes the redundancy bit line decoding system 915 receiving a bit line address input corresponding to the selected bit line. The applying includes the processing resources providing a signal to switch on the soft program pulse to the selected bit line. In one embodiment, the bit line address decoding system 910 output is logically combined with a second input signal for the redundancy bit line decoding 950, to generate the appropriate bit line decode signal, such as the $Y_{n0}$ signal 960-0 for the zero bit line in the first memory array 110, to switch on the soft program pulse to the subject bit line.

For high-density memory products having significant yield reductions from defective bit lines in a memory array, a redundancy system 170 can be utilized to enhance production yield. The defective bit lines are unusable and can be the result of the fabrication process as described above. The redundancy system 170, details of which are shown in FIGS. 9B and 9C, includes a second memory array 905 (see FIG. 9C) and processing resources. The bit lines in the second memory array 905 logically replace defective bit lines in the first memory array 110.

The inclusion of a redundancy system 170 in the integrated circuit is based on a trade off between the higher yield and the die size enlargement attributable to the redundancy system. For example, when the die size enlargement for the redundancy system 170 is relatively small and the yield improvement provided by use of the redundancy system is critically important, the appropriate product strategy is to include the redundancy system 170 in the integrated circuit.

For circumstances where the trade off favors an integrated circuit without additional processing resources to logically replace defective bit lines in the memory array, the redundancy system 170 is not included and the "basic" BLISP method 800 shown in FIG. 8A is used. For example, a first memory array 110 having no defective bit lines does not require a redundancy system 170. Similarly for certain integrated circuits having a first memory array 110 with a very low number of defective bit lines, the integrated circuit processing resources can ensure that the defective bit lines do not prevent the floating gate array from providing adequate functionality, without the inclusion of a redundancy system. For example, the integrated circuit can have processing resources, including an address counter and control unit that enable the memory to bypass a limited number of defective bit lines and therefore operate effectively despite the presence of such defective bit lines. The first memory array 110 for such an integrated circuit can have excess bit lines to enable replacement of the defective bit lines, or the operations performed by the first memory array can be performed even with the presence of a small number of defective bit lines.

The key difference between an integrated circuit having no more than a very low number of defective bit lines and an integrated circuit adapted to bypass defective bit lines 105 is that the latter has a redundancy system 170, as shown for one embodiment of the integrated circuit adapted to bypass defective bit lines in FIG. 1B. Another difference between the embodiment shown in FIG. 1B and the integrated circuit according to the SCIHE approach 100 is that the embodiment shown in FIG. 1B has a read and program control circuit that is separate from the block erase/erase verify/soft program circuit 125, instead of having a read/program control/block erase/erase verify/soft program circuit 120 that combines these functions. The read and program control circuit is also referred to herein as the control circuit 165. A third difference is that the SCIHE integrated circuit 100 has a voltage bias and an active current limiter 160. These elements are not required for the integrated circuit adapted to logically replace defective bit lines 105.

For the integrated circuit adapted to logically replace defective bit lines 105, the first memory array 110 is coupled with the read and program control circuit 165 and the block erase/erase verify/soft program circuit 125. The redundancy system 170 is also coupled with the read and program control circuit 165 and the block erase/erase verify/soft program circuit 125.

Figure 8B:
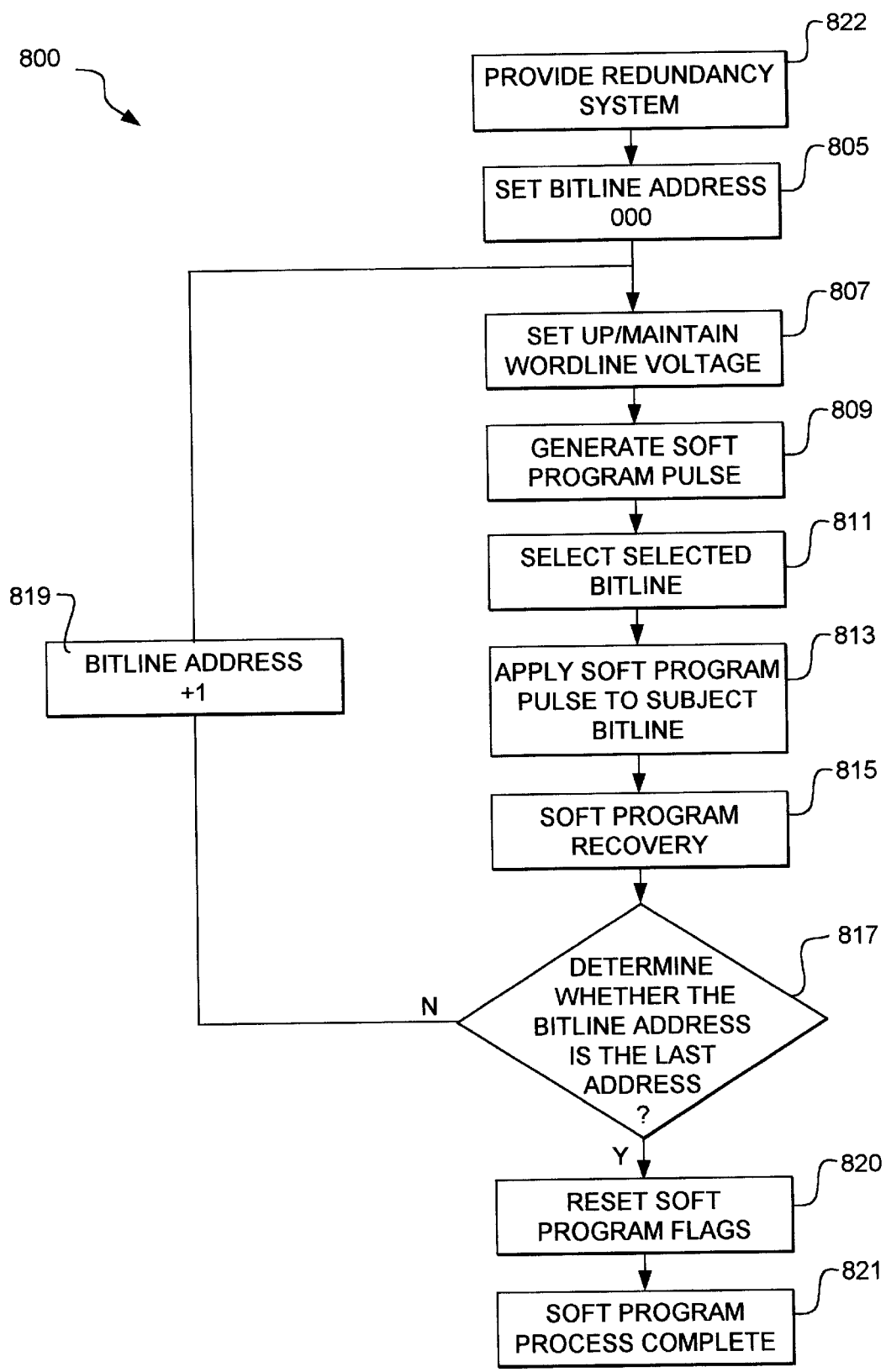
FIG. 8B is a flow diagram illustrating the bit line soft program (BLISP) method adapted to logically replace defective bit lines.

For integrated circuits having a larger number of defective bit lines, the redundancy system 170 is used by the BLISP method adapted to logically replace defective bit lines 801, as shown in FIG. 8B. The second memory array 905 has redundant bit lines. For such integrated circuits, the BLISP method adapted to logically replace defective bit lines 801 includes providing 822 the redundancy system 170. The BLISP method adapted to logically replace defective bit lines 801 also includes maintaining 807 the word lines at a predetermined word line voltage level, generating 809 a soft programming pulse having a soft programming voltage level, selecting 811 a selected bit line, and applying 813 the soft programming voltage level to a subject bit line.

For the BLISP method adapted to logically replace defective bit lines 801, the first memory array 110 includes two types of bit lines; defective bit lines and conforming bit lines. In some embodiments, at least one cell disposed on each of the defective bit lines remains below a targeted threshold voltage level after a first number of programming cycles. Therefore, the defective bit line is unusable. For example, referring to FIGS. 2A through 2C, if the second transistor 221, disposed in the second column of transistors 215, remains below a targeted threshold voltage after a first number of programming cycles, then the second global bit line 227 would be considered a defective bit line. The below target value threshold voltages of the cells in the defective bit lines contribute to over-erasing thereof when the cells are subject to repeated programming, erase, and soft programming cycles. In some embodiments, the first number of programming cycles is greater than two.

The second memory array 905 has redundant bit lines with floating gate memory cells that are configured to be programmed and erased. The redundancy system 170 includes processing resources and provides a bit line selection capability. The second memory array 905 can be coupled with the address counter 140 and the control circuit (reference number 165 in FIG. 1B and hereinafter in this application, and reference number 120 in FIG. 1A) to provide bit line addressing and selection. The selecting 811 of the selected bit line includes indicating a bit line type corresponding to the selected bit line. The processing resources disposed in the redundancy system 170 are adapted to perform the indicating. The bit line types include a conforming bit line type and a defective bit line type. In response to indicating the conforming bit line type, the subject bit line comprises the selected bit line. In response to indicating the defective bit line type, the subject bit line comprises a subject redundant bit line. The subject redundant bit line logically replaces the selected bit line.

For the example introduced above, where the second global bit line 227 is a defective bit line, when the selected bit line is the second global bit line, the selecting 811 of the selected bit line can include the redundancy system 170 processing resources indicating that the selected bit line is a defective bit line. The subject bit line will be a redundant bit line in the second memory array 905 that logically replaces the second global bit line 227.

On the other hand, the first global bit line 224 can be a conforming bit line. When the selected bit line is the conforming first global bit line 224, the selecting 811 of the selected bit line can include the redundancy system 170 processing resources indicating that the selected bit line is a conforming bit line. The subject bit line will be the first global bit line 224.

The applying 813 of the soft programming voltage level is to cells disposed on the subject bit line. Responsive to an indication of a conforming selected bit line the soft program pulse is applied to the selected bit line in the first memory array 110. Applying 813 of the soft programming voltage level occurs while the word line voltage is maintained 807.

In some embodiments of the, at least one of the defective bit lines requires greater charge injection from the soft programming pulse than each of the conforming bit lines to overcome an over-erased condition. For some of these embodiments, at least one cell disposed on each defective bit line remains below a targeted threshold voltage level after a first number of programming cycles. The first number of programming cycles can be greater than two.

The redundant bit lines logically replace defective selected bit lines in the first memory array 110 during the BLISP method adapted to logically replace defective bit lines 801, so that application of the soft program pulse to the defective bit lines can be prevented. Responsive to an indication of a defective selected bit line the soft program pulse is applied to a subject redundant bit line that logically replaces the selected defective bit line.

In some of these embodiments, the redundant bit lines also logically replace defective bit lines in the first memory cell array during the application of preprogramming, erase and programming cycle pulses, so that applications of these pulses to the defective bit lines can also be prevented. In some embodiments, both the redundant bit lines and the defective bit lines are subject to the preprogramming, erase and programming cycle pulses.

In some embodiments BLISP method adapted to logically replace defective bit lines 801, if the redundancy system 170 indicates that the bit line is defective, the applying 813 of the soft program pulse includes the redundancy system turning off the defective selected bit line so that the soft programming voltage level is not applied to cells disposed on the defective bit line. The applying 813 of the soft program pulse for this embodiment also includes the redundancy system turning on the subject redundant bit line so that the soft programming voltage level is applied to cells disposed on the subject redundant bit line.

The redundancy system 170 can indicate the bit line type corresponding to the selected bit line. In some embodiments, the bit lines in the first memory array 110 have addresses. The bit line addresses (shown in FIGS. 2A through 2C, and FIGS. 9A and 9B as $A_o$–$A_p$) can be provided from the command logic 150 and counted by the address counter 140.

In some embodiments where the bit lines have addresses, the redundancy system 170 processing resources can include a redundancy bit line decoding system 915. The redundancy bit line decoding system 915, shown in FIG. 9B can include a first set of cells 925 and a logic array. Each cell in the first set of cells 925 stores a bit line type indication corresponding to a predetermined bit line address in the first memory array 110.

The selecting 811 of a selected bit line can include the decoding system 910 receiving bit line selection inputs, such as bit line addresses, corresponding to the selected bit lines. The logic array can compare each bit line address input with the bit line type indication of the bit line corresponding to the address input.

Figure 9A:
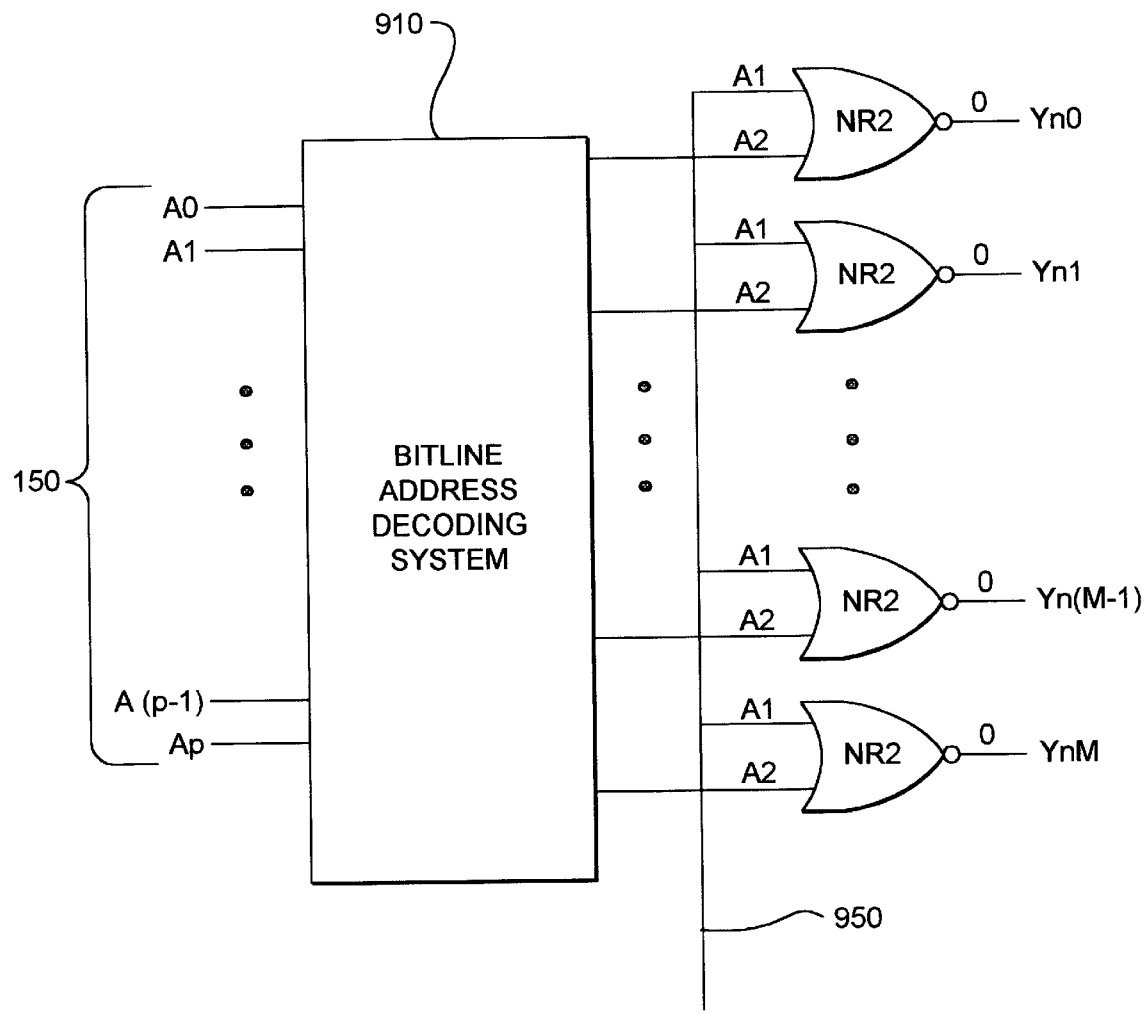
FIG. 9A is a schematic circuit diagram illustrating a bit line address decoding system connected to address inputs.
Figure 9B:
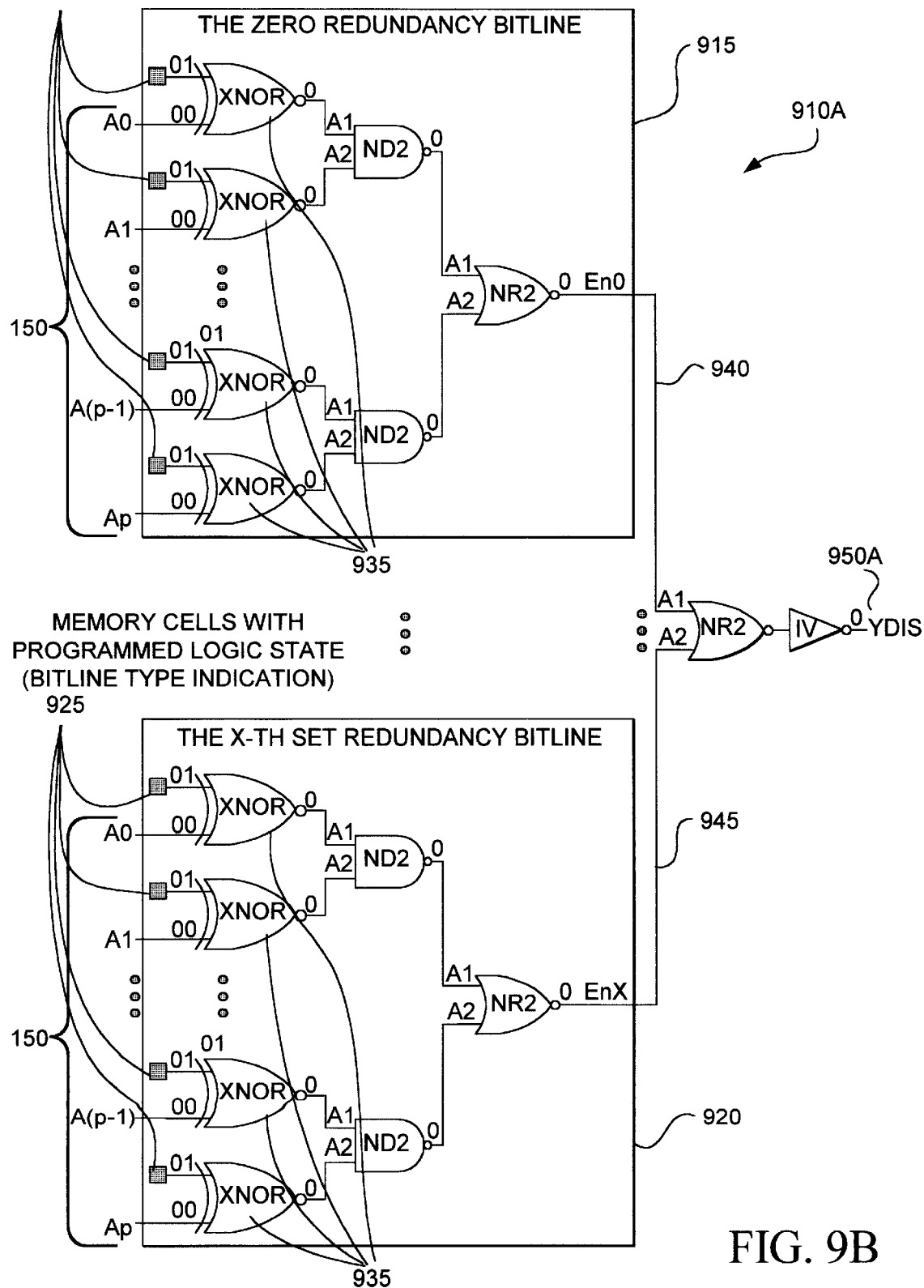
FIG. 9B is a schematic circuit diagram illustrating the redundancy bit line address decoding circuit disposed in a redundancy system.
Figure 9C:
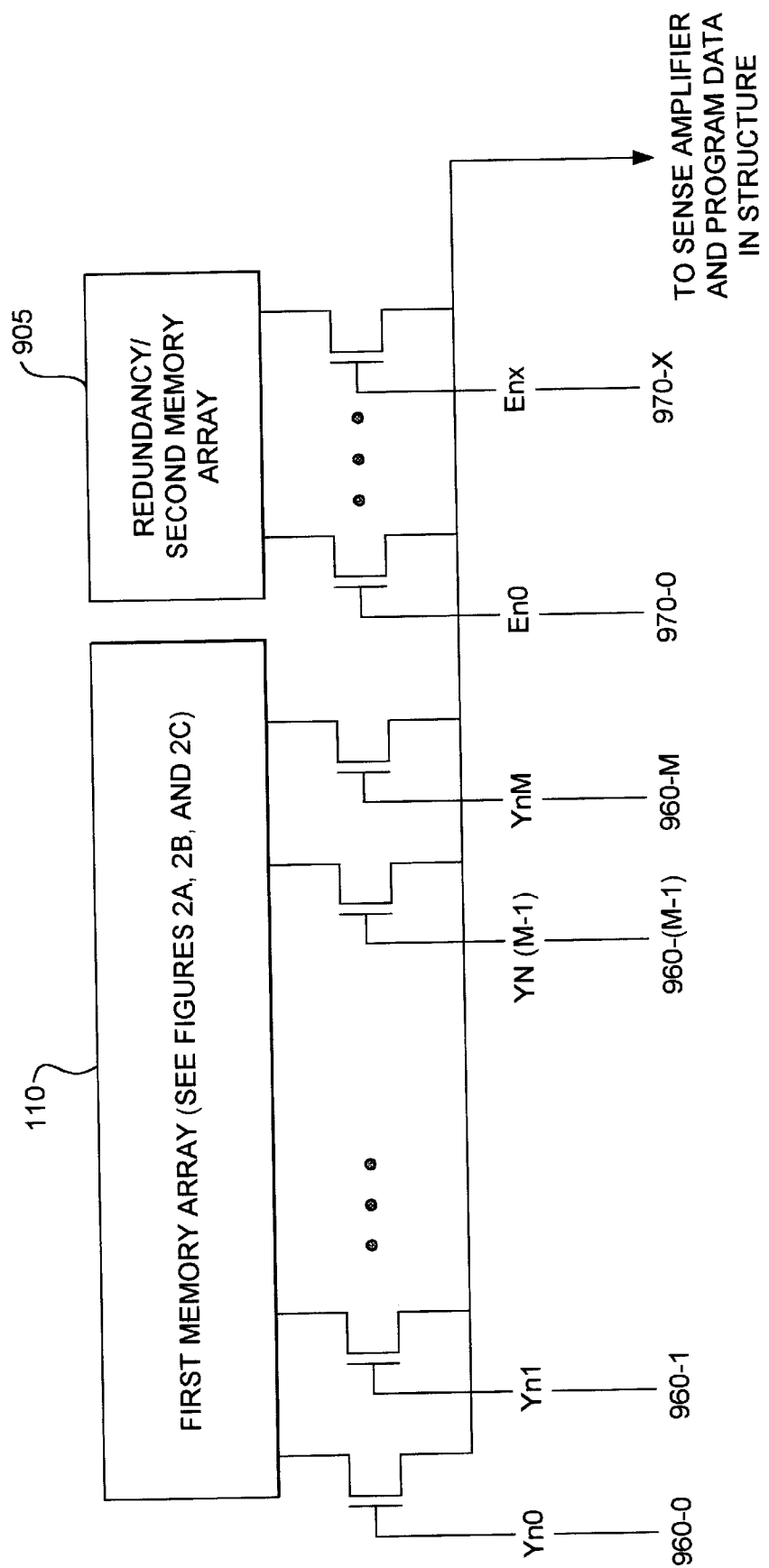
FIG. 9C is a schematic circuit diagram illustrating the connection of the bit line decode signals to the first cell array and the second memory array.

The applying 813 of the soft program pulse can include generating a signal, such as the second input signal 950 for bit line decoding shown in FIG. 9A. The second input signal 950 can switch off the soft programming pulse for all of the first memory array 110 cells in response to a defective bit line type indication for a selected bit line. The second input signal 950 can comprise a disable line input signal 950A for bit line decoding, shown in FIG. 9B as the YDIS signal. The disable line input signal 950A for bit line decoding is adapted to disable the set bit lines in the first memory array 110, for defective set bit lines. An enable signal, such as the $E_{n0}$ signal 970-0 in FIG. 9C, to switch on the soft programming pulse for the subject redundant bit line can also be generated in response to a defective bit line type indication. For example, as depicted in FIGS. 9A–9C, as the first memory cell array bit line address changes from $A_o$–$A_p$, the redundancy system processing resources compare the address information input with the pre-defined defective bit line addresses stored in the first set of cells 925. If the address is the same as one set of address information stored in the first set of cells 925, one of the redundancy enable signals $E_{n0}$–$E_{nx}$, e.g., $E_{n0}$ 940 for the zero redundancy bit line, or $E_{nx}$, 945 for the x-th redundancy bit line, turns on. The turned on redundancy enable signal switches off the $Y_{n0}$–$Y_{nm}$ bit line decode signals by providing a signal to the YDIS disable line 950A, thereby preventing application of the soft programming pulse to the defective bit line in the first memory cell array. The turned on redundancy enable signal also switches on the corresponding redundant bit line path in the second memory cell array.

For example, if the first indication of a defective bit line corresponds to the third bit line (not shown in FIGS. 2A–2C) in the first memory array 110, then the zero redundancy bit line would be turned on, when the third bit line was selected. The memory cells disposed in the zero redundancy bit line would receive the soft repair pulse. All of the $Y_{n0}$–$Y_{nm}$ decode signals would be turned off to prevent the $Y_{n2}$ decode signal from enabling the memory cells on the defective third bit line from receiving the soft repair pulse. If the second indication of a defective bit line corresponds to the seventh bit line (not shown in FIGS. 2A–2C) in the first memory array 110, then the first redundancy bit line would be turned on when the seventh bit line was selected. The memory cells disposed in the first redundancy bit line would receive the soft repair pulse. All of the $Y_{n0}$–$Y_{nm}$ decode signals would be turned off to prevent the $Y_{n6}$ decode signal from enabling the memory cells on the defective seventh bit line from receiving the soft repair pulse.

As shown in FIG. 9B the redundancy bit line decoding system disposed in the redundancy system 910A can include exclusive NOR gates 935 coupled to the bit line address inputs and the corresponding selected bit line type indications stored in the first set of cells 925. The applying 813 of the soft program pulse can include the exclusive NOR gates 935 toggling on a coupled redundant bit line enable signal in response to a defective selected bit line indication.

The applying 813 of the soft program pulse can also include responding to the indicating of the conforming bit line type by generating a signal, such as the $Y_{n0}$ signal 960-0 shown in FIG. 9C, to switch on the soft programming pulse to the selected bit line.

As discussed above, the BLISP method adapted to logically replace defective bit lines 801 logically replaces each defective bit line with a redundant bit line when applying 813 the soft programming voltage level. In the absence of such replacement, the presence of very low threshold voltage cells, or other types of defects, on the defective bit line can result in greater current demand during application of a soft repair pulse to the defective bit line. The increased current demand can be enough to cause the voltage level to spike. Therefore, applying 813 the soft programming voltage level only to the substitute redundant bit line avoids the high current consumption and voltage spiking that would occur if the soft program pulse were applied to the defective bit line. Therefore, the soft program is performed more efficiently.

Another problem that arises for soft programming of defective bit lines is that the voltage on the data line conductor 245 cannot be sustained at a sufficiently high level for efficient soft programming. This problem, caused by loss of current through the defective (very low threshold voltage) bit line cells, is exacerbated when the data line conductor 245 voltage is provided from a pumping circuit because the pumping circuit is characterized by a limited current supply capability.

Figures 1, 8C:
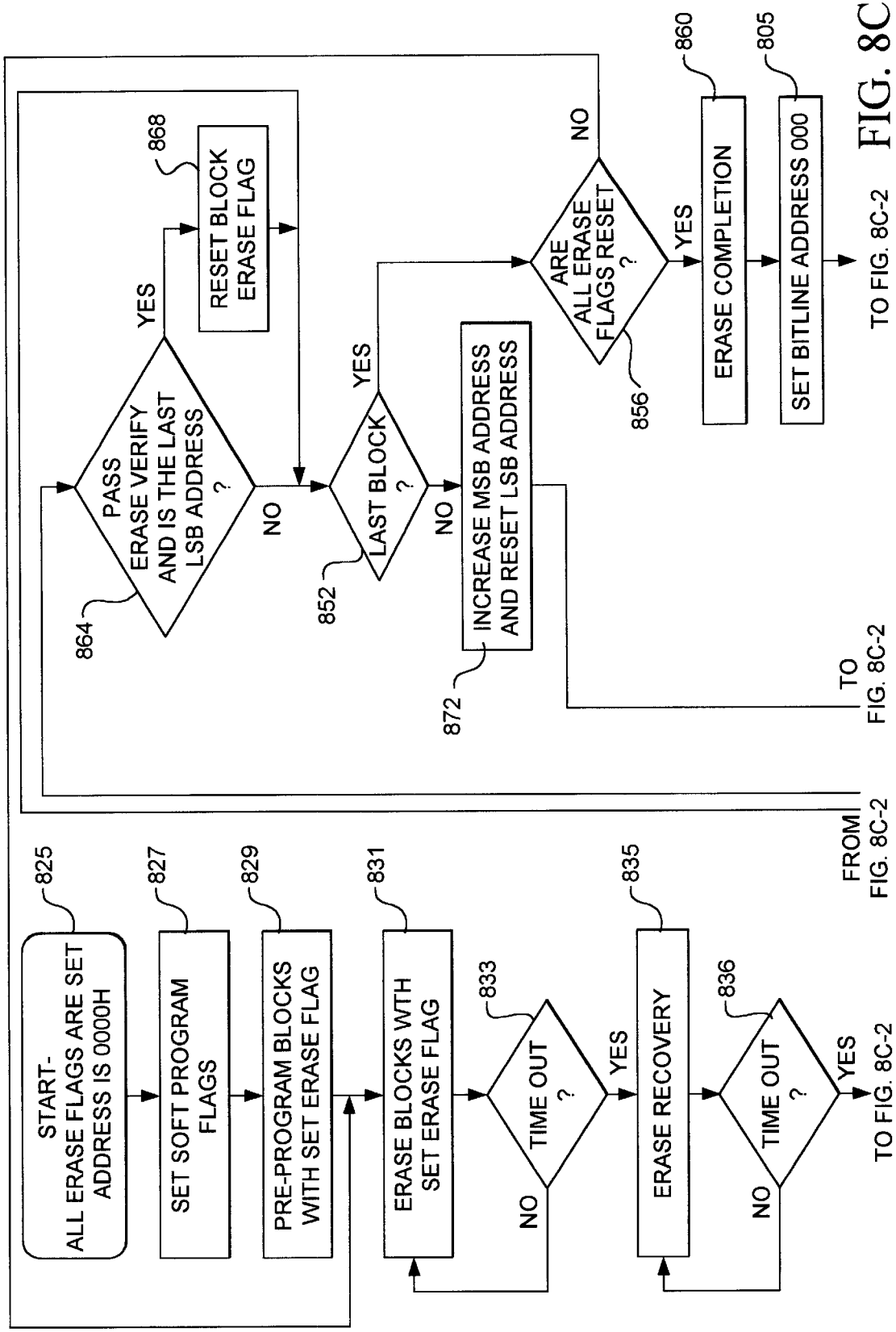
FIG. 8C is a flow chart of a block erase process including the BLISP method.
Figure 8C:
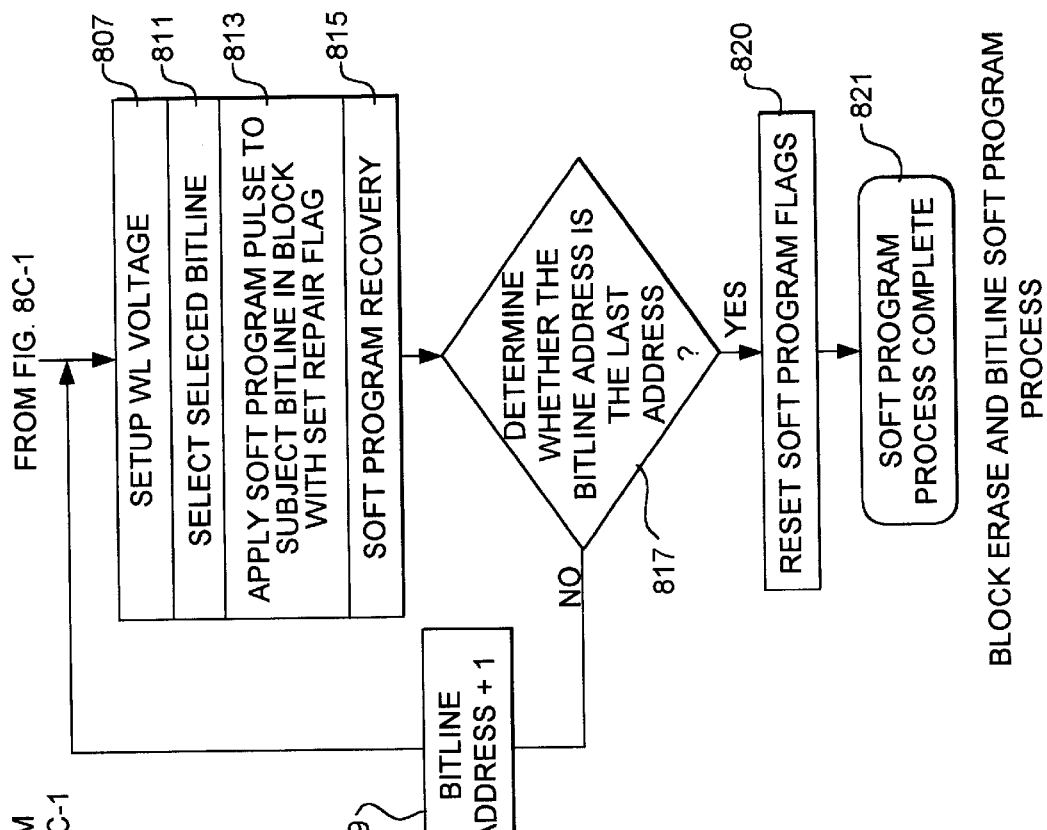

The BLISP method can also be implemented in a block erase process as shown in FIG. 8C. The first memory array 110 can include a plurality of blocks in a block-segmented architecture. The block segmented architecture can be as shown in any of FIGS. 2A–2C, or any other block segmented memory array architecture. Each block has at least one bit line. Prior to the soft programming, cells disposed in conforming bit lines disposed in blocks having set erase flags are erased. Cells disposed in redundant bit lines corresponding to defective bit lines disposed in blocks having set erase flags can also be erased prior to the soft programming. The same erase process can be provided for the BLISP method adapted to logically replace defective bit lines 801.

In some embodiments of the BLISP methods, a pre-program cycle is applied to the subject bit lines along with the erase and soft program cycles. Such embodiments are illustrated for a generalized soft program in FIG. 3B, for a SCIHE soft program in FIG. 3A, and in greater detail for the block erase and bit line soft program method 802, shown in FIG. 8C. The block erase and BLISP process 802 includes the steps discussed above for the BLISP process 800. The providing 822 the redundancy system step is only shown in FIG. 8B because this step is performed before any actual processing occurs, i.e., before the start step 825. The block erase steps 825 through 872 are as provided in FIG. 4 of U.S. Pat. No. 5,745,410, issued on Apr. 28, 1998, and incorporated by reference herein. A table providing reference numbers in FIG. 4 of U.S. Pat. No. 5,745,410 that correspond to the reference numbers 825 trough 872 in FIG. 8 herein is provided below.

| Description of Item | Reference #'s from FIG. 8 herein | Reference #'s from FIG. 4 of 5,745,410 |
| --- | --- | --- |
| Set flags indicating block erase | 825 | 99 |
| Set flags indicating block soft program (repair) | 827 | 99A |
| Pre-program blocks with set erase flags | 829 | 100 |
| Erase blocks with set erase flags | 831 | 101 |
| Determine whether erase time out duration has been reached | 833 | 102 |
| Erase recovery | 835 | 103 |
| Determine whether erase recovery time out duration has been reached | 836 | 104 |
| Set up erase verify voltages | 838 | 105 |
| Determine whether erase verify time out duration has been reached | 840 | N/A |
| Evaluate erase flags and test data in selected blocks | 842 | 106 |
| Erase flag set determination | 844 | 107 |
| Pass erase verify and not last least significant bit | 846 | 108 |
| Increase least significant bit address | 848 | 109 |
| Last block determination | 852 | 110 |
| All erase flags reset determination | 856 | 111 |
| Erase completion indication | 860 | 112 |
| Pass erase verify and last least significant bit | 864 | 113 |
| Reset block erase flag | 868 | 114 |
| Increase most significant bit and reset least significant bit | 872 | 115 |

The BLISP method 800 can be used in conjunction with the erase with SCIHE soft program 300 method, shown in FIG. 3A. This is accomplished by replacing the SCIHE soft program 350, and soft program recovery 355 steps with the BLISP method steps from setting 805 the bit line address through resetting 820 the soft program flags. Similarly, the BLISP method 800 can be implemented as part of the erase with generalized soft program 301 method. This is accomplished by replacing the generalized soft program 352, and soft program recovery 355 steps with the BLISP method steps from setting 805 the bit line address through resetting 820 the soft program flags. As described above, the other BLISP steps, as shown in FIG. 8A, include maintaining 807 the word line voltage, generating 809 the soft program pulse, selecting 811 the selected bit line, and applying 813 the soft program pulse to the subject bit line. The BLISP method can also include soft program recovery 815, and determining 817 whether the selected bit line address is the last bit line. The resetting 820 of the soft program flags is described below.

The sector erase and soft program method 802, shown in FIG. 8C includes an algorithm for the embedded erase and soft programming. The command logic 150 interprets inputs to set a mode of operation for the read and program control circuit 165. The control circuit 165 then generally executes the algorithm, or mode of operation. For embodiments where the first memory array 110 includes a plurality of blocks, the method can include erasing some of the memory cells. For example, cells disposed in selected conforming bit lines in blocks having erase flags can be erased. Also, cells disposed in subject redundant bit lines logically replacing defective bit lines can be erased, where the replaced defective bit lines are disposed in blocks having set erase flags.

The block-segmented architecture can be implemented so that certain blocks are not subject to any combination of one or more of the pre-program, erase, and soft program processes. For example if a block has a reset flag for a particular process, the pulses associated with that process are not applied to cells in the block. Instead, the blocks with reset blocks are passed without application of the pulse.

In some embodiments where the selected bit lines have soft programming flags, the BLISP method 800, and the BLISP method adapted to logically replace defective bit lines 801, can include setting the soft programming flags for the selected bit lines. Where the bit lines have addresses, the BLISP methods can include determining 817 whether the selected bit line address corresponds to a last address.

For example, before the applying 813 of the soft program pulse, the address counter 140 can set the selected bit line address to 000. The 000-bit line corresponds to the bit line connected to the $Y_{00}$ signal for the first block that has a set soft programming flag. After applying 813 the soft program pulse for each subject bit line, the BLISP method 800 can include the block erase, erase verify, and soft program repair state machine 125 determining 817 whether the selected bit line address corresponds to a last address. This determination is typically made using the address counter in the soft program repair state machine 125. The same type of determination can be made for the BLISP method adapted to logically replace defective bit lines 801.

If the selected bit line address corresponds to the last address, the BLISP methods can include resetting 820 the soft programming flags corresponding to the selected bit lines. The resetting 820 of the soft programming flags is typically performed by the block erase, erase verify, and soft program repair state machine 125. If the selected bit line address does not correspond to the last address, the BLISP methods include incrementing 819 the bit line address. The maintaining 807 word line voltage, selecting 811 selected bit line, and applying 813 the soft program pulse steps are then performed for a next subject bit line corresponding to the incremented address.

A second aspect of the invention provides a method for correcting an over-erase condition within a non-volatile memory array. The method includes providing a first non-volatile memory array, such as the first memory array 110 in FIGS. 1A and 1B, in an integrated circuit. The array has a plurality of floating gate memory cells 400. Each floating gate memory cell 400, as shown in FIG. 4 and described above in the SCIHE section, includes a stacked pair of gates including a control gate 401 and a floating gate 402. The gates are spaced above a channel region, or well 404, and are interposed between a source 403 and a drain 405 region. The memory cells are arranged in bit lines. The method includes selecting 811 a selected bit line. The method for correcting an over-erase condition also includes applying a first voltage to the control gate 401, an active current limiter (or sink 420) to the source 403 region, a non-positive voltage to the channel region, and a positive second voltage to the drain 405 region of memory cells disposed on a subject bit line corresponding to the selected bit line. The application of the first voltage corresponds to maintaining 807 the word line voltage, and the application of the second voltage corresponds to the applying 813 of the soft program pulse.

In some embodiments of method for correcting an over-erase condition, the subject bit line comprises the selected bit line. In some embodiments, the first voltage is between minus one volt and six volts.

In some embodiments of method for correcting an over-erase condition, the first non-volatile memory array includes conforming bit lines and defective bit lines. The selecting includes indicating a bit line type corresponding to the selected bit line. The integrated circuit includes a redundancy system 170 including a second non-volatile memory array having a plurality of memory cells, such as the second memory array 905 shown in FIG. 9C, and processing resources. Each memory cell in the second array has the same features described above for the first array memory cells. The second memory array memory cells are arranged as redundant bit lines. The processing resources are adapted to perform the indicating. The bit line types include a conforming bit line type and a defective bit line type. In response to indicating the conforming bit line type, the subject bit line comprises the selected bit line. In response to indicating the defective bit line type, the second voltage is not applied to the selected bit line, and the subject bit line includes a subject redundant bit line logically replacing the selected bit line Integrated Circuit for Bit Line Soft Programming A third aspect of the invention provides an integrated circuit capable of implementing the bit line soft programming (BLISP) method. The integrated circuit comprises a first memory array 110, processing resources, word lines (such as word lines $WL_0$ through $WL_N$ in FIGS. 2A through 2C), and a control circuit 165. The first memory array 110 has floating gate memory cells 400 disposed on bit lines, such as the first local bit line 203 and the second local bit line 206. For purposes of bit line selection, the processing resources typically address such local bit lines, but for the architecture illustrated in FIGS. 2A through 2C, the addressable bit lines include the first global bit line 224 and the second global bit line 227. Each of the floating gate memory cells 400 in the first memory array has a control gate 401, a floating gate 402, a source 403, and a drain 405. The processing resources are adapted to select 811 selected bit lines for soft programming. The word lines are in communication with the control gates 401. The control circuit 165 is coupled with the processing resources to apply 813 a soft program pulse to the floating gate memory cells 400 disposed on subject bit lines, the subject bit lines corresponding to selected bit lines.

In some embodiments of the integrated circuit, the subject bit lines comprise the selected bit lines. In some embodiments, the selected bit lines have corresponding soft programming flags; and the control circuit 165 is adapted to set the soft program flags for the selected bit lines prior to the maintaining.

In some embodiments of the integrated circuit, the first memory array 110 is arranged in blocks of memory cells. Each of the blocks has at least one bit line, and a block erase flag corresponding to the block. A block erase/erase verify/soft program circuit 125, otherwise referred to herein as a "state machine circuit", and the processing resources are coupled to erase, prior to the soft programming, cells disposed in the subject bit lines disposed in blocks having set erase flags.

For some of the embodiments where the first memory array 110 is arranged in blocks of memory cells, the bit lines have addresses. The block erase/erase verify/soft program circuit 125 is adapted to determine whether the selected bit line address corresponds to a last address after the applying. In response to the selected bit line address corresponding to the last address, the block erase/erase verify/soft program circuit 125 resets the soft programming flags. In response to the selected bit line address not corresponding to the last address, the address counter 140 increments the bit line address, and to cause the integrated circuit to repeat the soft program for a next bit line corresponding to the incremented address.

In some embodiments of the integrated circuit, the control circuit 165 is adapted to maintain the word lines at a predetermined voltage level. The voltage level set on the word lines is between approximately above ground and 0.5 volts. The applying includes applying 813 a soft program pulse to the subject bit lines while maintaining 807 the word line voltage. In some embodiments, the soft programming pulse repairs over-erased cells so that the over-erased cells may be reprogrammed absent a previously applied repair verify operation.

In some embodiments of the integrated circuit, the first memory array 110 includes a plurality of blocks, arranged in rows and columns. Each block includes the bit lines, the word lines, and source lines. The control circuit 165 is coupled to the bit lines, the source lines, and the word lines. The control circuit 165 is adapted to set threshold voltages of the cells in selected blocks to a low threshold voltage. The control circuit 165 includes voltage supply circuits to supply a voltage sequence to lower the threshold voltages of cells in each selected block. The voltage sequence results in a first group of cells having threshold voltages lowered below a selected limit for the threshold voltage. The voltage supply circuits supply a soft programming pulse to subject bit lines disposed in each selected block during a soft programming time interval across the source lines and the bit lines, while setting the voltage on the word lines to a level below the selected limit. The current consumption for the circuit during soft programming is fixed. The higher threshold voltage bits, i.e., non over-erased cells therefore consume less current than the over-erased cells; and the logic states of the higher threshold cells are not affected by the soft program.

In some embodiments of the third aspect, the first memory array is arranged in rows and columns. The integrated circuit includes well lines coupled to wells of respective rows of cells in the first memory array 110. The control circuit 165 includes voltage supply circuits to supply a well voltage on the well lines corresponding to the selected bit lines. The control circuit 165 couples a current limiter circuit 500 to the source lines corresponding to the selected bit lines. In some embodiments, the processing resources include a soft program repair state machine and an address counter 140.

In some embodiments of the integrated circuit, the first memory array 110 bit lines comprise defective bit lines and conforming bit lines. The integrated circuit includes a redundancy system 170 having a second array of floating gate memory cells 400 disposed on redundant bit lines, and processing resources. Each of the floating gate memory cells 400 in the second memory array 905 has a control gate 401, a floating gate 402, a source 403, and a drain 405. The redundant bit lines logically replace the defective bit lines. The processing resources adapted to indicate bit line types of the selected bit lines in the first memory array are disposed in the redundancy system 170. The subject bit lines include selected conforming bit lines and subject redundant bit lines logically replacing selected defective bit lines. The control circuit 165 is adapted to cooperate with the redundancy system 170 to prevent applying of the soft program to floating gate memory cells 400 disposed on defective bit lines.

For some of the embodiments of the integrated circuit having a redundancy system 170, the applying includes applying 813 a soft program pulse. The bit lines in the first memory array 110 have addresses. The redundancy system 170 processing resources include a redundancy bit line address decoding system, referred to herein as a redundancy bit line decoding system 915. The redundancy bit line decoding system 915 includes a first set 925 of cells, a logic array, and processing resources. Each cell in the first set 925 of cells stores a bit line type indication corresponding to a predetermined bit line address. The logic array is adapted to compare each bit line address input with the bit line type indication corresponding to the address input. The processing resources are adapted to receive bit line address inputs corresponding to the selected bit lines. The processing resources respond to a defective bit line type indication by generating a signal to switch off the soft programming pulse for the first memory array bit lines. The processing resources respond to a conforming bit line type indication by generating a signal to switch on the soft programming pulse for the selected bit line.

For some of the embodiments of the integrated circuit having a redundancy system 170, the applying includes applying 813 a soft program pulse. Responsive to an indication of the conforming bit line type, the redundancy system 170 processing resources are adapted to enable applying 813 of the soft program pulse to the selected bit lines. Responsive to an indication of the defective bit line type, the processing resources are adapted to disable applying 813 of the soft program pulse to the selected bit lines, and enable application of the soft program pulse to the subject redundant bit lines logically replacing the selected bit lines.

For some of the embodiments of the integrated circuit having a redundancy system 170, the first memory array 110 is arranged in blocks of memory cells. Each of the blocks has at least one bit line, and a block erase flag corresponding to the block. The control circuit 165 and the redundancy system 170 processing resources are coupled to erase, prior to the soft programming, cells disposed in the selected conforming bit lines disposed in blocks having set erase flags. The control circuit 165 and the redundancy system 170 processing resources are also coupled to erase, prior to the soft programming, cells disposed in the subject redundant bit lines logically replacing defective bit lines, the defective bit lines disposed in blocks having set erase flags.

For some of the embodiments of the integrated circuit having a redundancy system 170, the cells in the first memory array 110 and the second memory array 905 are arranged in rows and columns. The integrated circuit includes well lines coupled to wells 404 of respective rows of cells in the first memory array 110 and coupled to respective rows of cells in the second memory array 905. The control circuit 165 includes voltage supply circuits supply a well voltage on the well lines corresponding to the selected bit lines. The control circuit 165 couples an active current limiter circuit 500 to the source lines corresponding to the selected bit lines.

For some of the embodiments of the integrated circuit having a redundancy system 170, the applying includes applying 813 a soft program pulse. The bit lines in the first memory 110 array have addresses. The redundancy system 170 processing resources include a redundancy bit line decoding system 915 having a first set 925 of cells. Each cell in the first set 925 stores a bit line type indication corresponding to a predetermined bit line address. The redundancy bit line decoding system 915 also has a logic array. The logic array is adapted to compare each bit line address input with the bit line type indication corresponding to the address input. The decoding system 910 is adapted to receive bit line address inputs corresponding to the selected bit lines.

The redundancy bit line decoding system 915 processing resources are adapted to respond to a defective bit line type indication by generating a signal to switch off the soft programming pulse for the first memory array 110 bit lines, and to switch on the soft programming pulse for the subject redundant bit line. The redundancy bit line decoding system 915 processing resources are adapted to respond to a conforming bit line type indication by generating a signal to switch on the soft programming pulse to the selected bit line. The decoding system 910 can include exclusive NOR gates 935 coupled to the bit line address inputs and the corresponding bit line type indications. Responsive to defective selected bit line type indications, the exclusive NOR gates 935 are adapted to toggle on the coupled redundant bit line enable signals.

A fourth aspect of the invention provides a floating gate memory comprising floating gate memory cells 400, a first circuit, and a second circuit. The first circuit can include a bit line decoder system 910, as shown in FIG. 9A. The second circuit can include a gate switch 410, a source switch 411, a well switch 412, and a drain switch 413, as shown in FIG. 4. Each of the floating gate memory cells 400 has a control gate 401, a floating gate 402, a source 403, and a drain 405. The floating gate memory cells 400 are disposed on bit lines in a first memory array. The first circuit is adapted to select selected bit lines. The second circuit is adapted to soft program floating gate cells in subject bit lines. The subject bit lines correspond to the selected bit lines. The second circuit is also adapted to supply a gate voltage to the control gate 401, a current limiter circuit 500 to the drain 405, a well voltage to a well 404, and a source voltage to the source 403 of the floating gate memory cells 400 disposed on the subject bit lines. Note that the current limiter circuit 500 shown in FIG. 5 comprises an active current limiter.

For some of the embodiments, the memory includes floating gate memory cells having a drain 405, a control gate 401, a floating gate 402, a well 404, and a source 403. The floating gate cells are disposed on bit lines in a second memory array 905. The second circuit is adapted to supply a gate voltage to the control gate 401, an active current limiter to the drain 405, a well voltage to the well 404, and a source voltage to the source 403 of the cells in the second memory array 905. The subject floating gate cells are also disposed on redundant bit lines. The redundant bit lines are disposed in the second memory array 905. The redundant bit lines logically replace the defective bit lines in the first memory array 110.

The details of some of the different embodiments of the integrated circuit correspond to the details provided above in the BLISP method 800 section.

The foregoing description of embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. In a floating gate integrated circuit having a first memory array including a plurality of bit lines identified by bit line addresses, the bit lines coupled to floating gate memory cells configured to be programmed and erased, wherein each of the cells has a drain, a source, and a control gate, and wherein the control gates of the cells are in communication with word lines, a method for soft programing floating gate memory cells comprising:

maintaining the word lines at a predetermined word line voltage level;

generating a soft programming pulse having a soft programing voltage level;

selecting a selected bit line in response to a bit line address; and applying the soft programming voltage level to cells disposed on a subject bit line corresponding to the selected bit line.

2. The soft programming method of claim 1, wherein the subject bit line comprises the selected bit line.

3. In a floating gate integrated circuit having a first memory array including a plurality of bit lines, the bit lines corresponding to floating gate memory cells configured to be programmed and erased, wherein each of the cells has a drain, a source, and a control gate, and wherein the control gates of the cells are in communication with word lines, a method for soft programming floating gate memory cells comprising:

maintaining the word lines at a predetermined word line voltage level;

generating a soft programming pulse having a soft programming voltage level;

selecting a selected bit line; and applying the soft programming voltage level to cells disposed on a subject bit line corresponding to the selected bit line, wherein:

the first memory array includes conforming bit lines and defective bit lines;

the selecting includes indicating a bit line type corresponding to the selected bit line, the integrated circuit includes a redundancy system including a second memory array and processing resources, the second memory array having redundant bit lines, the processing resources adapted to perform the indicating, the bit line types including a conforming bit line type and a defective bit line type;

responsive to indicating the conforming bit line type, the subject bit line comprising the selected bit line; and responsive to indicating the defective bit line type, the subject bit line comprising a subject redundant bit line, the subject redundant bit line logically replacing the selected bit line.

4. The soft programming method of claim 1, wherein:

the selected bit lines have corresponding soft programming flags, and the method includes, prior to the maintaining, setting the soft program flags for the selected bit lines.

5. The soft programming method of claim 1, wherein the first memory array includes a plurality of blocks, each block having at least one bit line, and wherein prior to the soft programming the method includes erasing cells disposed in the bit lines disposed in blocks having set erase flags.

6. The soft programming method of claim 1, wherein the predetermined word line voltage level is between approximately above ground and 0.5 volts.

7. The soft programming method of claim 1, wherein the soft programming pulse repairs over-erased cells so that the over-erased cells may be reprogrammed absent a previously applied repair verify operation.

8. The soft programming method of claim 1, wherein:

the integrated circuit includes processing resources including a redundancy bit line decoding system;

the selecting includes the decoding system receiving a bit line address input corresponding to the selected bit line; and the applying includes the processing resources providing a signal to switch on the soft program pulse to the subject bit line.

9. The soft programming method of claim 3, wherein at least one of the defective bit lines requires greater charge injection from the soft programming pulse than each of the conforming bit lines to overcome an over-erased condition.

10. The soft programming method of claim 3, wherein the first memory array includes a plurality of blocks, each of the blocks having at least one bit line, and wherein prior to the soft programming the method includes:

erasing cells disposed in conforming bit lines disposed in blocks having set erase flags; and erasing cells disposed in subject redundant bit lines logically replacing defective bit lines disposed in the blocks having set erase flags.

11. The soft programming method of claim 3, wherein responsive to the indicating of the defective bit line type, the applying includes:

the redundancy system turning off the selected bit line so that the soft programming voltage level is not applied to cells disposed on the selected bit line; and the redundancy system turning on the subject redundant bit line so that the soft programming voltage level is applied to cells disposed on the subject redundant bit line.

12. The soft programming method of claim 3, wherein:

the bit lines in the first memory array have addresses, the processing resources include a redundancy bit line decoding system having a first set of cells and a logic array, each cell in the first set storing a bit line type indication corresponding to a predetermined bit line address;

the indicating includes:

the redundancy bit line decoding system receiving a bit line address input corresponding to the selected bit line;

the logic array comparing the bit line address input with the bit line type indication of the bit line corresponding to the address input; and the applying includes:

responsive to the indicating of the defective bit line type, generating a signal to switch off the soft programming pulse for all of the first memory array cells, and to switch on the soft programming pulse for the subject redundant bit line; and responsive to the indicating of the conforming bit line type, generating a signal to switch on the soft programming pulse to the selected bit line.

13. The soft programming method of claim 4, wherein after the applying, the method includes:

determining whether the selected bit line address corresponds to a last address;

responsive to the selected bit line address corresponding to the last address, resetting the soft programming flags for the selected bit lines; and responsive to the selected bit line address not corresponding to the last address, incrementing the bit line address and repeating the maintaining, generating, selecting, and applying for a next bit line corresponding to the incremented address.

14. The soft programming method of claim 8, wherein at least one cell disposed on each defective bit line remains below a targeted threshold voltage level after a first number of programming cycles.

15. The soft programming method of claim 12, wherein:

the redundancy bit line decoding system includes an exclusive NOR gate coupled to the bit line address input and the corresponding bit line type indication; and the applying includes, responsive to the indicating of the defective bit line type, the corresponding exclusive NOR gate toggling on a coupled redundant bit line enable signal.

16. The soft programming method of claim 14, wherein the first number of programming cycles is greater than two.

* * * * *